(12) United States Patent
Tanaka et al.

(10) Patent No.: US 8,062,955 B2
(45) Date of Patent: Nov. 22, 2011

(54) SUBSTRATE PROCESSING METHOD AND SUBSTRATE PROCESSING APPARATUS

(75) Inventors: Takashi Tanaka, Nirasaki (JP); Kenichi Hara, Nirasaki (JP); Mitsuaki Iwashita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 564 days.

(21) Appl. No.: 12/091,131

(22) PCT Filed: Jun. 22, 2007

(86) PCT No.: PCT/JP2007/062624
§ 371 (c)(1),
(2), (4) Date: Apr. 22, 2008

(87) PCT Pub. No.: WO2008/001697
PCT Pub. Date: Jan. 3, 2008

(65) Prior Publication Data
US 2008/0280437 A1  Nov. 13, 2008

(30) Foreign Application Priority Data

Jun. 26, 2006  (JP) .................................. 2006-174745
Jul. 14, 2006  (JP) .................................. 2006-194758

(51) Int. Cl.
*H01L 21/76* (2006.01)
(52) U.S. Cl. ....................................................... 438/437
(58) Field of Classification Search .................. None
See application file for complete search history.

(56) References Cited

U.S. PATENT DOCUMENTS

| 2005/0069646 A1* | 3/2005 | Inoue et al. ................... 427/304 |
| 2005/0095830 A1* | 5/2005 | Weidman et al. ............. 438/584 |
| 2006/0234503 A1* | 10/2006 | Yamada et al. ............... 438/667 |
| 2007/0004202 A1* | 1/2007 | Fujii ............................. 438/678 |
| 2008/0314870 A1* | 12/2008 | Inoue et al. ..................... 216/38 |

FOREIGN PATENT DOCUMENTS

| JP | 61 87875 | 5/1986 |
| JP | 2000 58487 | 2/2000 |
| JP | 2000 178753 | 6/2000 |
| JP | 2000-328256 | 11/2000 |
| JP | 2001-73157 | 3/2001 |

(Continued)

OTHER PUBLICATIONS

Office Action issued Oct. 13, 2010, in Taiwan Patent Application No. 096123117 (with partial English translation).
Office Action issued Sep. 7, 2010, in Japan Patent Application No. 2008-522550 (with English translation).

(Continued)

*Primary Examiner* — Charles Garber
*Assistant Examiner* — Andre' Stevenson
(74) *Attorney, Agent, or Firm* — Oblon, Spivak, McClelland, Maier & Neustadt, L.L.P.

(57) ABSTRACT

A CoWB film is formed as a cap metal on a Cu interconnection line formed on a substrate or wafer W, by repeating a plating step and a post-cleaning step a plurality of times. The plating step is arranged to apply electroless plating containing CoWB onto the Cu interconnection line. The post-cleaning step is arranged to clean the wafer W by use of a cleaning liquid, after the plating step.

15 Claims, 14 Drawing Sheets

FOREIGN PATENT DOCUMENTS

| | | |
|---|---|---|
| JP | 2003 179058 | 6/2003 |
| JP | 2003 264159 | 9/2003 |
| JP | 2006 9131 | 1/2006 |
| JP | 2006 93357 | 4/2006 |
| JP | 2006 111938 | 4/2006 |
| WO | WO 2008/001698 A1 | 1/2008 |

OTHER PUBLICATIONS

Office Action issued Sep. 7, 2010, in Japan Patent Application No. 2008-522551 (with English translation).

Office Action issued Dec. 23, 2010, in Taiwan Patent Application No. 096123118 (with partial English translation).

* cited by examiner

US 8,062,955 B2

SUBSTRATE PROCESSING METHOD AND SUBSTRATE PROCESSING APPARATUS

TECHNICAL FIELD

The present invention relates to a substrate processing method and substrate processing apparatus for performing a series of steps for forming a plated film on an interconnection line formed on a substrate, such as a semiconductor substrate.

BACKGROUND ART

As regards semiconductor devices, recently, their integration degree thereof is required to increase owing to the demands for a higher operation speed, and thus Cu (copper) is used as an interconnection line metal, because Cu has a low resistivity. Where Cu is used for an interconnection line, the current density is increased, but therefore electro-migration (EM: migration of Cu atoms by an electric current) can easily be caused. The electro-migration may bring about disconnection of the interconnection line and thereby deteriorate the reliability.

In light of this problem, the following method has been proposed to improve the EM resistance of semiconductor devices (for example, see Patent Document 1). Specifically, a plating liquid containing, e.g., CoWB (cobalt tungsten boron) or CoWP (cobalt tungsten phosphorous) is supplied onto the surface of a substrate provided with a Cu interconnection line, so that a metal film of, e.g., CoWB or CoWP, which is called a cap metal, is formed by electroless plating to cover the Cu interconnection line.

In general, a cap metal described above is formed by supplying a plating liquid onto the surface of a substrate provided with a Cu interconnection line. After the cap metal is formed, cleaning of the substrate is performed by use of a cleaning liquid to remove the excess part of the plating liquid deposited on portions of the substrate other than the interconnection line (for example, see Patent Documents 2 and 3).

Typically, in electroless plating performed by use of a plating liquid containing, e.g., CoWB or CoWP, the plating process is promoted by the electromotive force of electrons generated by decomposition of a reducing agent, such as dimethylamineborane (DMAB), which is a derivative of sodium borohydride (SBH) contained in the plating liquid, and hydrogen gas is generated due to decomposition of the reducing agent. If the hydrogen gas brings about bubbles adsorbed on a metal film in the plating process, the plating process cannot proceed at portions corresponding to the bubbles and around the bubbles, so voids are formed in the metal film due to the bubbles and damage the continuity of the metal film. In general, a metal film of, e.g., CoWB or CoWP is poly-crystalline, and thus the film includes crystal grain boundaries and has a low density with large clearances (pinholes) at the crystal grain boundaries.

After the cap metal is formed, slurry-like by-products (residues) generated by the plating reaction are normally present on the surface of the cap metal, and are dried and precipitated in due time. If the precipitated substances are left on the surface of the cap metal, the leakage electric current between interconnection lines may be increased. In order to solve this problem, cleaning of the substrate may be performed to remove the precipitated substances. However, since the precipitated substances strongly stick to the plated surface, the precipitated substances may be difficult to sufficiently remove by the conventional cleaning liquid and cleaning step. Further, the substrate surface may be dried due to deterioration of the wettability relative to a chemical liquid, along with a change in hydrophilic/hydrophobic property. This may cause re-oxidation of the Cu surface.

As described above, the conventional plating method entails difficulties in forming a cap metal of high quality, and thus cannot sufficiently improve the EM resistance of semiconductor devices

[Patent Document 1]
Jpn. Pat. Appln. KOKAI Publication No. 2006-111938
[Patent Document 2]
Jpn. Pat. Appln. KOKAI Publication No. 2000-58487
[Patent Document 3]
Jpn. Pat. Appln. KOKAI Publication No. 2003-179058

DISCLOSURE OF INVENTION

An object of the present invention is to provide a substrate processing method and substrate processing apparatus that can form an electroless plated film of high quality on an interconnection line.

According to a first aspect of the present invention, there is provided a substrate processing method comprising: applying electroless plating of a Co (cobalt) alloy onto a Cu (copper) interconnection line formed on a substrate; and performing a post-cleaning process by use of a cleaning liquid on the substrate, after the electroless plating, wherein the method is arranged to repeat the electroless plating and the post-cleaning process a plurality of times, thereby forming a plated film on the interconnection line.

In the first aspect, the post-cleaning process may comprise performing a rinsing process for removing an electroless plating liquid deposited on the substrate, by use of a rinsing liquid as the cleaning liquid. The post-cleaning process may comprise: performing a first rinsing process for removing an electroless plating liquid deposited on the substrate, by use of a rinsing liquid as the cleaning liquid; performing a chemical liquid process for removing a by-product formed by an electroless plating reaction on a surface of the interconnection line, by use of a chemical liquid as the cleaning liquid, after the first rinsing process; and performing a second rinsing process for removing the chemical liquid deposited on the substrate, by use of a rinsing liquid as the cleaning liquid, after the chemical liquid process. The method is preferably arranged to perform the post-cleaning process before a plated surface formed by the electroless plating is dried. The chemical liquid may be acidic with a pH of 3 or more. The chemical liquid may contain a surfactant.

According to a second aspect of the present invention, there is provided a substrate processing method comprising: setting a surface of a substrate to be hydrophilic, the surface being provided with a Cu (copper) interconnection line formed thereon; applying electroless plating of a Co (cobalt) alloy onto the Cu (copper) interconnection line, after the hydrophilic setting; performing a post-cleaning process by use of a cleaning liquid on the substrate, after the electroless plating; and performing a drying process on the substrate, after the post-cleaning process, wherein the method is arranged to repeat the hydrophilic setting, the electroless plating, the post-cleaning process, and the drying process a plurality of times in this order, without drying the substrate from the hydrophilic setting to the drying process, thereby forming a plated film on the interconnection line.

According to a third aspect of the present invention, there is provided a substrate processing method comprising: performing a pre-cleaning process on a substrate by use of a cleaning liquid, thereby removing an oxide film and/or a contaminant from a Cu (copper) interconnection line formed on the substrate; applying electroless plating of a Co (cobalt)

alloy onto the Cu (copper) interconnection line, after the pre-cleaning process; and performing a post-cleaning process by use of a cleaning liquid on the substrate, after the electroless plating, wherein the method is arranged to repeat the pre-cleaning process, the electroless plating, and the post-cleaning process a plurality of times in this order, without drying the substrate during the pre-cleaning process, the electroless plating, and the post-cleaning process, thereby forming a plated film on the interconnection line.

According to a fourth aspect of the present invention, there is provided a substrate processing method comprising: setting a surface of a substrate to be hydrophilic, the surface being provided with a Cu (copper) interconnection line formed thereon; performing a pre-cleaning process on the substrate by use of a cleaning liquid, thereby removing an oxide film and/or a contaminant from the Cu (copper) interconnection line formed on the substrate; applying electroless plating of a Co (cobalt) alloy onto the Cu (copper) interconnection line, after the pre-cleaning process; performing a post-cleaning process by use of a cleaning liquid on the substrate, after the electroless plating; and performing a drying process on the substrate, after the post-cleaning process, wherein the method is arranged to repeat the hydrophilic setting, the pre-cleaning process, the electroless plating, the post-cleaning process, and the drying process a plurality of times in this order, without drying the substrate from the hydrophilic setting to the drying process, thereby forming a plated film on the interconnection line.

According to a fifth aspect of the present invention, there is provided a substrate processing method for forming an electroless plated film of a Co (cobalt) alloy on a Cu (copper) interconnection line formed on a substrate, in a substrate processing apparatus comprising a spin chuck configured to hold and rotate the substrate in a horizontal state and a surrounding member configured to surround a peripheral edge of the substrate held on the spin chuck, the method comprising: setting the substrate to be held on the spin chuck; rotating the substrate by the spin chuck and supplying a plating liquid onto the substrate, thereby applying electroless plating onto the interconnection line, while receiving by the surrounding member the plating liquid thrown off from the substrate; and rotating the substrate by the spin chuck and supplying a cleaning liquid onto the substrate, after the electroless plating, thereby performing a post-cleaning process on the substrate, while receiving by the surrounding member the cleaning liquid thrown off from the substrate, wherein the method is arranged to repeat the electroless plating and the post-cleaning process a plurality of times, and to perform the post-cleaning process before a plated surface formed by the electroless plating is dried.

In the fifth aspect, the post-cleaning process may comprise performing a rinsing process for removing the electroless plating liquid deposited on the substrate, by use of a rinsing liquid as the cleaning liquid. The post-cleaning process may comprise: performing a first rinsing process for removing the electroless plating liquid deposited on the substrate, by use of a rinsing liquid as the cleaning liquid; performing a chemical liquid process for removing a by-product formed by an electroless plating reaction on a surface of the interconnection line, by use of a chemical liquid as the cleaning liquid, after the first rinsing process; and performing a second rinsing process for removing the chemical liquid deposited on the substrate, by use of a rinsing liquid as the cleaning liquid, after the chemical liquid process.

In the fifth aspect, the method may be arranged such that the surrounding member includes an inner surrounding member configured to move up and down relative to the spin chuck between a surrounding position for surrounding the peripheral edge of the substrate held on the spin chuck and a retreat position for retreating from the peripheral edge of the substrate, and an outer surrounding member disposed outside the inner surrounding member and configured to surround the peripheral edge of the substrate when the inner surrounding member retreats from the peripheral edge of the substrate; the electroless plating is performed while one of the inner surrounding member and the outer surrounding member surrounds the peripheral edge of the substrate held on the spin chuck; the first rinsing process of the post-cleaning is performed while the inner surrounding member and the outer surrounding member remain unchanged; the chemical liquid process of the post-cleaning process is performed while the other of the inner surrounding member and the outer surrounding member surrounds the peripheral edge of the substrate held on the spin chuck; and the second rinsing process of the post-cleaning process is performed while the inner surrounding member and the outer surrounding member are in the same state as that of the chemical liquid process.

In the fifth aspect, the chemical liquid may be acidic with a pH of 3 or more. The chemical liquid may contain a surfactant. The Co alloy is preferably CoWB (cobalt tungsten boron) or CoWP (cobalt tungsten phosphorous).

According to a sixth aspect of the present invention, there is provided a substrate processing apparatus for forming a plated film by applying electroless plating of a Co (cobalt) alloy onto a Cu (copper) interconnection line formed on a substrate, the apparatus comprising: a spin chuck configured to hold and rotate the substrate in a horizontal state; a surrounding member configured to surround a peripheral edge of the substrate held on the spin chuck; a plating liquid supply mechanism configured to supply a plating liquid onto the substrate held on the spin chuck; a cleaning liquid supply mechanism configured to supply a cleaning liquid onto the substrate held on the spin chuck; and a control section configured to control rotation by the spin chuck, supply of the plating liquid by the plating liquid supply mechanism, and supply of the cleaning liquid by the cleaning liquid supply mechanism, wherein the control section is preset to repeat an electroless plating process and a post-cleaning process a plurality of times, without drying a plated surface, the electroless plating process being arranged to rotate the substrate by the spin chuck and supply the plating liquid onto the substrate, thereby applying electroless plating onto the interconnection line, while receiving by the surrounding member the plating liquid thrown off from the substrate, and the post-cleaning process being arranged to rotate the substrate by the spin chuck and supply the cleaning liquid onto the substrate, after the electroless plating process, thereby performing post-cleaning on the substrate, while receiving by the surrounding member the cleaning liquid thrown off from the substrate.

In the sixth aspect, the apparatus may be arranged such that the cleaning liquid supply mechanism is configured to supply a chemical liquid and a rinsing liquid as the cleaning liquid, and wherein the control section is preset to control the post-cleaning process to sequentially comprise: performing a first rinsing process for removing an electroless plating liquid deposited on the substrate, by use of a rinsing liquid as the cleaning liquid; performing a chemical liquid process for removing a by-product formed by an electroless plating reaction on a surface of the interconnection line, by use of a chemical liquid as the cleaning liquid; and performing a second rinsing process for removing the chemical liquid deposited on the substrate, by use of a rinsing liquid as the cleaning liquid, after the chemical liquid process.

In the sixth aspect, the apparatus may be arranged such that the surrounding member includes: an inner surrounding member configured to move up and down relative to the spin chuck between a surrounding position for surrounding the peripheral edge of the substrate held on the spin chuck and a retreat position for retreating from the peripheral edge of the substrate; and an outer surrounding member disposed outside the inner surrounding member and configured to surround the peripheral edge of the substrate when the inner surrounding member retreats from the peripheral edge of the substrate, and wherein the control section is preset to control the inner surrounding member and the outer surrounding member to move up and down relative to each other, such that: the electroless plating is performed while one of the inner surrounding member and the outer surrounding member surrounds the peripheral edge of the substrate held on the spin chuck; the first rinsing process of the post-cleaning is performed while the inner surrounding member and the outer surrounding member remain unchanged; the chemical liquid process of the post-cleaning process is performed while the other of the inner surrounding member and the outer surrounding member surrounds the peripheral edge of the substrate held on the spin chuck; and the second rinsing process of the post-cleaning process is performed while the inner surrounding member and the outer surrounding member are in the same state as that of the chemical liquid process.

According to a seventh aspect of the present invention, there is provided a storage medium that stores a program for execution on a computer to control a substrate processing apparatus, wherein the program, when executed, causes the computer to control the substrate processing apparatus to conduct a substrate processing method comprising: applying electroless plating of a Co (cobalt) alloy onto a Cu (copper) interconnection line formed on a substrate; and performing a post-cleaning process by use of a cleaning liquid on the substrate, after the electroless plating, wherein the method is arranged to repeat the electroless plating and the post-cleaning process a plurality of times, thereby forming a plated film on the interconnection line.

According to an eighth aspect of the present invention, there is provided a storage medium that stores a program for execution on a computer to control a substrate processing apparatus comprising a spin chuck configured to hold and rotate a substrate in a horizontal state and a surrounding member configured to surround a peripheral edge of the substrate held on the spin chuck, wherein the program, when executed, causes the computer to control the substrate processing apparatus to conduct a substrate processing method for forming an electroless plated film of a Co (cobalt) alloy on a Cu (copper) interconnection line formed on the substrate, the method comprising: setting the substrate to be held on the spin chuck; rotating the substrate by the spin chuck and supplying a plating liquid onto the substrate, thereby applying electroless plating onto the interconnection line, while receiving by the surrounding member the plating liquid thrown off from the substrate; and rotating the substrate by the spin chuck and supplying a cleaning liquid onto the substrate, after the electroless plating, thereby performing a post-cleaning process on the substrate, while receiving by the surrounding member the cleaning liquid thrown off from the substrate, wherein the method is arranged to repeat the electroless plating and the post-cleaning process a plurality of times, and to perform the post-cleaning process before a plated surface formed by the electroless plating is dried.

According to the present invention, electroless plating is repeated a plurality of times on the interconnection line to form a plated film. In this case, the interconnection line is effectively prevented from being exposed by generation of voids due to hydrogen gas and bubbling of gas dissolved in the plating liquid and pinholes at crystal grain boundaries. Hence, the coverage of the plated film is improved to prevent the metal of the interconnection line from being diffused, so the electro-migration resistance and barrier property are remarkably improved. Further, after the electroless plating, cleaning is performed on the substrate by use of a cleaning liquid. Consequently, a by-product generated by the plating reaction on the surface of the plated film, which may increase the leakage electric current, is removed, so the plated film is provided with high quality.

Further, steps may be performed without drying the substrate from the electroless plating process through the post-cleaning, and preferably during a series of steps including the electroless plating process. In this case, several problems can be solved, such as generation of a precipitated by-product that is difficult to remove, oxidation of the Cu interconnection line layer, and deterioration in the morphology of the plated film. Consequently, the plated film formed by the electroless plating on the interconnection line is improved in quality.

BEST MODE FOR CARRYING OUT THE INVENTION

Embodiments of the present invention will now be described with reference to the accompanying drawings.

Figure 1:
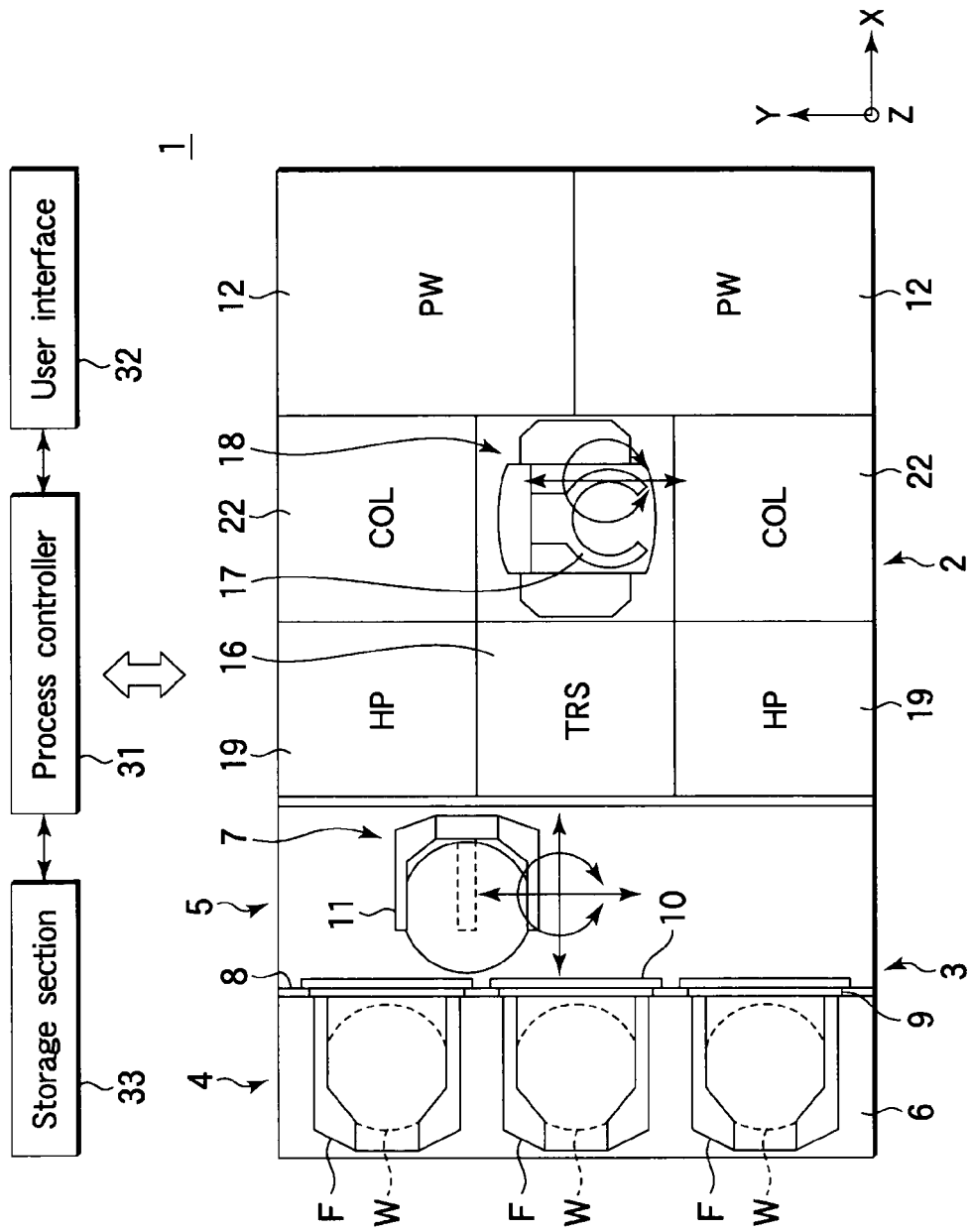
FIG. 1 This is a plan view schematically showing the structure of an electroless plating system including an electroless plating unit that can be used for performing a substrate processing method according to the present invention.

FIG. 1 is a plan view schematically showing the structure of an electroless plating system including an electroless plating unit that can be used for performing a substrate processing method according to the present invention.

The electroless plating system 1 includes a process section 2 and an I/O (IN/OUT) section 3. The process section 2 is arranged to perform an electroless plating process on a wafer W provided with an interconnection line made of, e.g., Cu, and to perform processes before and after the electroless plating process. The I/O section 3 is arranged to transfer wafers W to and from the process section 2.

The I/O section 3 includes an I/O port 4 and a wafer transfer area 5. The I/O port 4 is provided with a table 6 for placing thereon FOUPs (front opening unified pod) F, each of which can store a plurality of wafers W in a horizontal state at predetermined intervals in the vertical direction. The wafer transfer area 5 is provided with a wafer transfer mechanism 7 for transferring wafers W between the FOUPs F placed on the table 6 and the process section 2.

Each FOUP F has a transfer port formed on one side for transferring wafers W therethrough, and a lid provided on this side for opening/closing the transfer port. The FOUP F has a plurality of slots arrayed in the vertical direction for inserting wafers W, wherein each of the slots supports one wafer W such that its front surface (the surface provided with an interconnection line) faces upward.

The table 6 of the I/O port 4 can place thereon a plurality of, such as three, FOUPs F, which are arrayed in the width direction (Y-direction) of the electroless plating system 1, such that the side of each FOUP F having the transfer port faces a partition wall 8 between the I/O port 4 and wafer transfer area 5. The partition wall 8 has window portions 9 formed therein at positions corresponding to the mount positions for FOUPs F. Each of the window portions 9a is provided with a shutter 10 on the wafer transfer area 5 side for opening/closing the window portion 9.

The shutter 10 is arranged to open/close the lid 10a of a FOUP F at the same time when it opens/closes the window portion 9. The shutter 10 is preferably provided with an interlock to prevent its operation when no FOUP F is placed on the predetermined position of the table 6. After the shutter 10 is operated to open the window portion 9, so as to set the transfer port of the FOUP F to communicate with the wafer transfer area 5, the wafer transfer mechanism 7 of the wafer transfer area 5 can access the FOUP F.

The wafer transfer mechanism 7 has a transfer pick 11 for holding a wafer W, and is movable in the Y-direction. The transfer pick 11 is movable back and forth in the longitudinal direction of the electroless plating system 1 (X-direction), movable up and down in the height direction of the electroless plating system 1 (Z-direction), and rotatable in the X-Y plane. With this arrangement, the wafer transfer mechanism 7 can transfer a wafer W between any one of the FOUPs F placed on the table 6 and each transit unit (TRS) 16 disposed in the process section 2.

The process section 2 includes transit units (TRS) 16, electroless plating units (PW) 12 (substrate processing apparatuses), hot plate units (HP) 19, cooling units (COL) 22, and a main wafer transfer mechanism 18. Each of the transit units (TRS) 16 is arranged to temporarily place a wafer W therein when the wafer W is transferred to and from the wafer transfer area 5. Each of the electroless plating units (PW) 12 is arranged to perform an electroless plating process on a wafer W, and to perform processes, such as cleaning, on the wafer W before and after the electroless plating process. Each of the hot plate units (HP) 19 is arranged to perform a heating process on a wafer W before and after the processes performed in the electroless plating units (PW) 12. Each of the cooling units (COL) 22 is arranged to cool a wafer W heated in one or more of the hot plate units (HP) 19. The main wafer transfer mechanism 18 can access the respective units to transfer wafers W between the units. The process section 2 is provided with a filter/fan unit (not shown) at the ceiling for supplying clean air as a down flow to the respective units and main wafer transfer mechanism 18.

A plurality of, such as two, transit units (TRS) 16 are stacked one on the other at a position between the wafer transfer area 5 and the main wafer transfer mechanism 18 located essentially at the center of the process section 2. The lower transit unit (TRS) 16 is used to place therein a wafer W transferred from the I/O section 3 to the process section 2. The upper transit unit (TRS) 16 is used to place therein a wafer W transferred from the process section 2 to the I/O section 3. A plurality of, such as four, hot plate units (HP) 19 are stacked one on the other at each of the opposite sides of the transit units (TRS) 16 in the Y-direction. A plurality of, such as four, cooling units (COL) 22 are stacked one on the other at each of the opposite sides of the main wafer transfer mechanism 18 in the Y-direction, to be adjacent to the hot plate units (HP) 19. A plurality of, such as two, electroless plating units (PW) 12 are stacked one on the other at each of two positions arrayed in the Y-direction, to be adjacent to the cooling units (COL) 22 and main wafer transfer mechanism 18.

The main wafer transfer mechanism 18 has a plurality of transfer arms 17 disposed on, e.g., the upper and lower sides for transferring wafers W. The transfer arms 17 are movable up and down in the Z-direction, rotatable in the X-Y plane, and movable back and forth in the X-Y plane. With this arrangement, the main wafer transfer mechanism 18 can transfer wafers W between the respective transit units (TRS) 16, electroless plating units (PW) 12, hot plate units (HP) 19, and cooling units (COL) 22.

The electroless plating system 1 is connected to and controlled by a process controller 31 comprising a microprocessor (computer). The process controller 31 is connected to the user interface 32, which includes, e.g., a keyboard and a display, wherein the keyboard is used for a process operator to input commands for operating the respective components or units in the electroless plating system 1, and the display is used for showing visualized images of the operational status of the respective components or units in the electroless plating system 1. Further, the process controller 31 is connected to a storage section 33 that stores recipes with control programs and process condition data recorded therein for the process controller 31 to control the electroless plating system 1 so as to perform various processes. A required recipe is retrieved from the storage section 33 and executed by the process controller 31 in accordance with an instruction or the like input through the user interface 32. Consequently, the electroless plating system 1 can perform a predetermined process under the control of the process controller 31. The recipes may be used while they are stored in a readable storage medium, such as a CD-ROM, hard disk, or nonvolatile memory. Alternatively, the recipes may be used online while they are transmitted between the respective components or units in the electroless plating system 1, or transmitted from an external apparatus through, e.g., a dedicated line, as needed.

Figure 6:
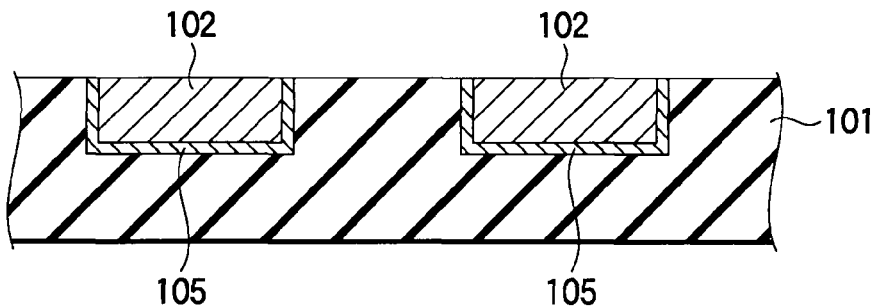
FIG. 6 This is a sectional view showing the structure of a wafer to be processed in the electroless plating system.

A wafer W to be processed in the electroless plating system 1 is structured as shown in FIG. 6, for example. Specifically, an insulating film 101 made of a material, such as $SiO_2$, is formed on the surface of a plate-like substrate (not shown) made of a material, such as Si. A groove is formed in the surface of the insulating film 101, and is covered with a barrier metal 105. An interconnection line 102 made of, e.g., Cu is formed on the barrier metal 105 in the groove of the insulating film 101. In the electroless plating system 1, a FOUP F storing wafers W to be processed is placed at a predetermined position on the table 6 of the I/O port 4 by a transfer robot or operator. Then, the wafers W are taken out one by one from the FOUP F by the transfer pick 11 of the wafer transfer mechanism 7, and each of the wafers thus taken out is transferred into one of the transit units (TRS) 16. Where a corrosion resistant organic film is present on the surface of the interconnection line 102, the wafer W is transferred by one of the transfer arms 17 of the main wafer transfer mechanism 18 from the transit unit (TRS) 16 to one of the hot plate units (HP) 19. In this hot plate unit (HP) 19, a pre-baking process is performed on the wafer W, so that the organic film is sublimed. Then, the wafer W is transferred by the main wafer transfer mechanism 18 from the hot plate unit (HP) 19 to one of the cooling units (COL) 22, in which the wafer W is cooled.

Then, the wafer W is transferred by the main wafer transfer mechanism 18 to one of the electroless plating units (PW) 12. In this electroless plating unit (PW) 12, an electroless plating process is performed on the interconnection line 102 formed on the wafer W, and processes, such as cleaning, are performed on the wafer W before and after the electroless plating process. The electroless plating units (PW) 12 will be explained later in detail.

After the process in the electroless plating unit (PW) 12 is finished, the wafer W is transferred by the main wafer transfer mechanism 18 to one of the transit units (TRS) 16. Then, the wafer W is transferred by the transfer pick 11 of the wafer transfer mechanism 7 from the transit unit (TRS) 16 to the original slot of the FOUP F. Alternatively, after the process in the electroless plating unit (PW) 12 is finished, a post-baking process may be performed on the wafer W, as needed, before the wafer W is transferred to one of the transit units (TRS) 16. In this case, the wafer W is transferred by the main wafer transfer mechanism 18 from the electroless plating unit (PW) 12 to one of the hot plate units (HP) 19. In this hot plate unit (HP) 19, a post-baking process is performed on the wafer W to sublime organic substances contained in the cap metal formed to cover the interconnection line 102 by the electroless plating process, and to improve the adhesive property of the cap metal relative to the interconnection line 102. Thereafter, the wafer W is transferred by the main wafer transfer mechanism 18 from the hot plate unit (HP) 19 to one of the cooling units (COL) 22, in which the wafer W is cooled.

Next, a detailed explanation will be given of the electroless plating units (PW) 12.

Figure 2:
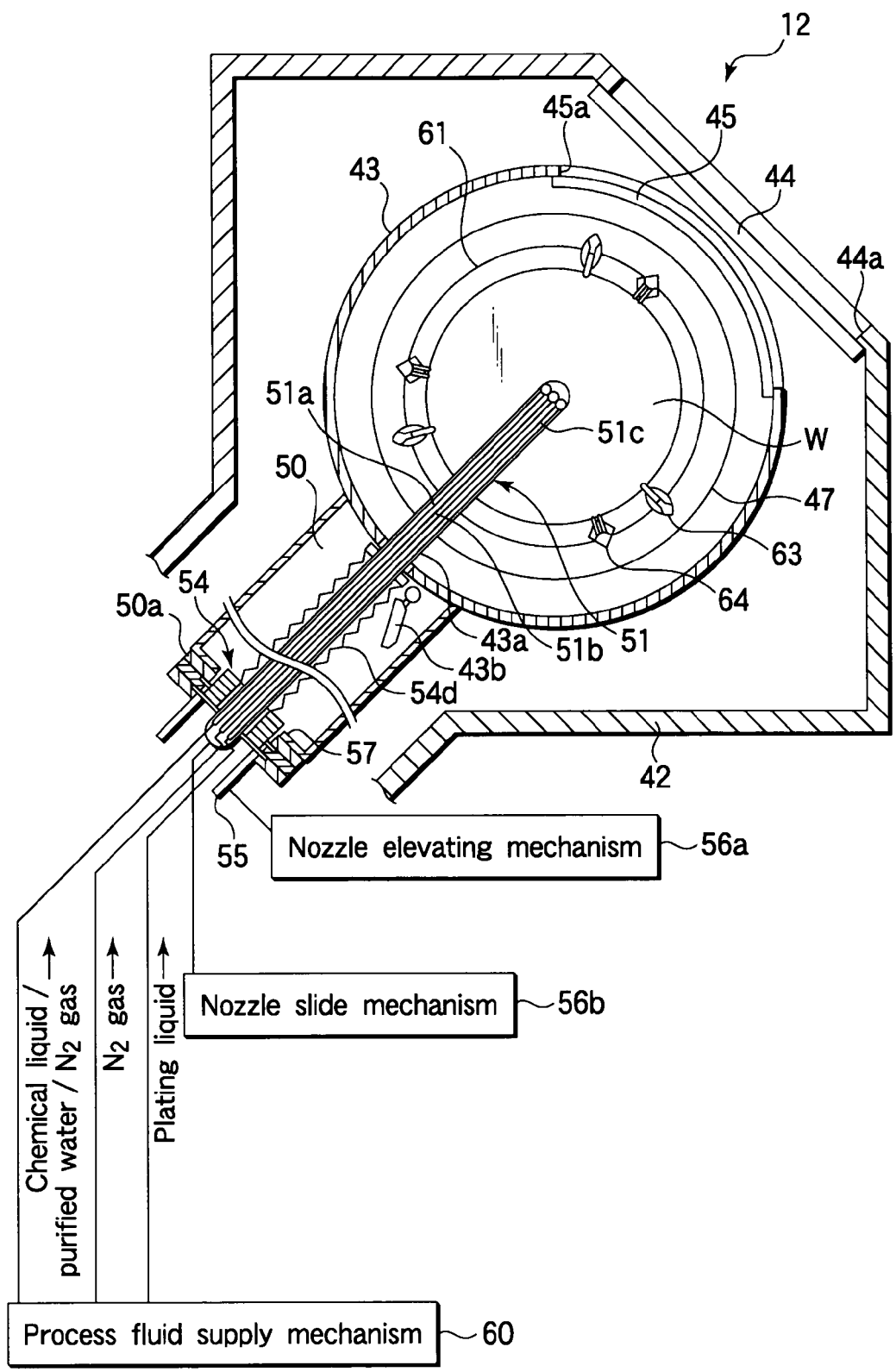
FIG. 2 This is a plan view schematically showing the electroless plating unit.
Figure 3:
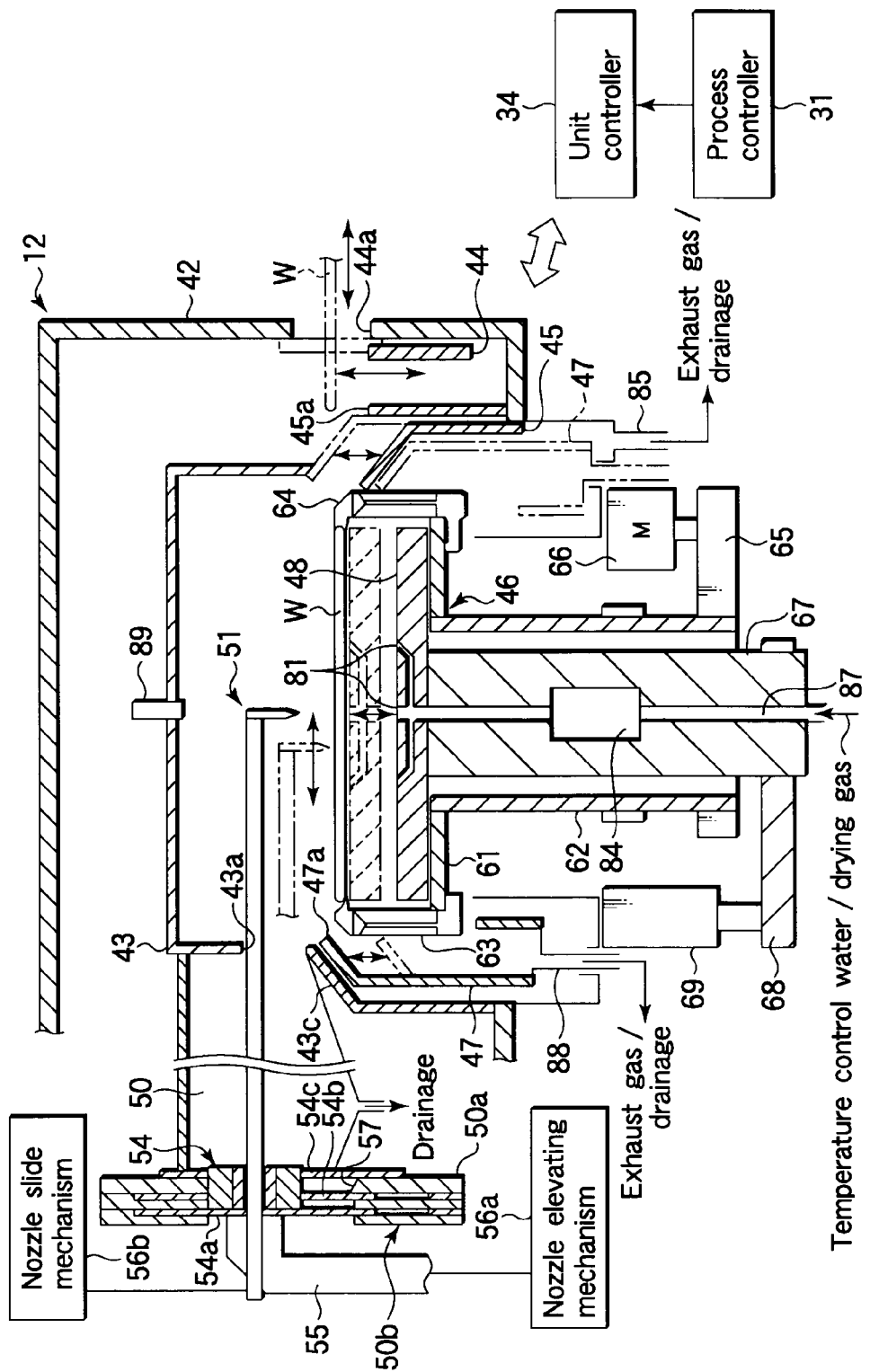
FIG. 3 This is a sectional view schematically showing the electroless plating unit.

FIG. 2 is a plan view schematically showing each of the electroless plating units (PW) 12. FIG. 3 is a sectional view schematically showing this electroless plating unit (PW) 12.

The electroless plating unit (PW) 12 includes a housing 42, in which an outer chamber 43 (outer surrounding member) and an inner cup 47 (inner surrounding member) inside the outer chamber 43 are disposed. A spin chuck 46 is disposed inside the inner cup 47 to hold and rotate the wafer W in a horizontal or almost horizontal state. A nozzle unit 51 is disposed to supply liquid and gas, such as a plating liquid and a cleaning liquid, onto the wafer W held on the spin chuck 46.

The housing 42 has a window portion 44a formed on the sidewall, so that the wafer W is transferred therethrough by one of the transfer arms 17 to and from the housing 42. The window portion 44a is provided with a first shutter 44 for opening/closing the window portion 44a.

The outer chamber 43 has a cylindrical or box-like shape with an opening at the bottom and a sidewall configured to surround the wafer W held on the spin chuck 46. The sidewall of the outer chamber 43 has a tapered portion 43c with an inner wall inclined inward and upward at a height level essentially the same as the wafer W held on the spin chuck 46. The tapered portion 43c has a window portion 45a formed therein to face the window portion 44a of the housing 42, so that the wafer W is transferred therethrough by one of the transfer arms 17 to and from the outer chamber 43. The window portion 45a is provided with a second shutter 45 for opening/closing the window portion 45a.

The upper wall of the outer chamber 43 is provided with a gas supply port 89 for supplying nitrogen gas ($N_2$) or clean air to form a down flow into the outer chamber 43. The annular bottom wall of the outer chamber 43 is provided with a drain 85 for discharging exhaust gas and drainage.

The inner cup 47 has a cylindrical shape with openings at the top and bottom. The inner cup 47 is movable up and down by an elevating mechanism, such as a gas cylinder, between a process position (see the solid lines in FIG. 3) for surrounding the wafer W held on the spin chuck 46 and a retreat position (see the phantom lines in FIG. 3) for retreating below the wafer W held on the spin chuck 46. The inner cup 47 has a tapered portion 47a inclined inward and upward at the upper end corresponding to the tapered portion 43c of the outer chamber 43. The annular bottom wall of the inner cup 47 is provided with a drain 88 for discharging exhaust gas and drainage. When the inner cup 47 is set at the process position, the tapered portion 47a is present at a height level essentially the same as the wafer W held on the spin chuck 46.

The inner cup 47 is set at the process position, when the electroless plating process is performed on the wafer W held on the spin chuck 46. In this state, the plating liquid supplied from the nozzle unit 51 onto the wafer W, as described later, and dropping from the wafer W, bouncing from wafer W, or thrown off from the wafer W by rotation of the spin chuck 46 is received by the tapered portion 47a of the inner cup 47 and so forth, so that the plating liquid is prevented from scattering around the inner cup 47. The inner wall of the inner cup 47 is preferably provided with corrosion resistant means, such as a hydrogen fluoride resin coating, corresponding to the plating liquid, so that the inner wall is protected from corrosion due to deposition of the plating liquid. The plating liquid received by the inner cup 47 is guided to the drain 88. The drain 88 is connected to a collection line (not shown), so that the plating liquid is collected through the collection line and is recycled or discarded (disposal of drainage).

The inner cup 47 is set at the retreat position, when the wafer W is transferred between one of the transfer arms 17 and spin chuck 46, or when cleaning is performed on the wafer W by use of a chemical liquid. Accordingly, when cleaning is performed on the wafer W by use of a chemical liquid, the wafer W held on the spin chuck 46 is surrounded by the outer chamber 43. In this state, the chemical liquid supplied from the nozzle unit 51 onto the wafer W, as described later, and dropping from the wafer W, bouncing from wafer W, or thrown off from the wafer W by rotation of the spin chuck 46 is received by the tapered portion 43c of the outer chamber 43 and so forth, so that the plating liquid is prevented from scattering around the outer chamber 43. At this time, the chemical liquid is also received by the outer wall of the tapered portion 47a of the inner cup 47. The inner wall of the outer chamber 43 and the outer wall of the tapered portion 47a of the inner cup 47 are preferably provided with corrosion resistant means, such as a hydrogen fluoride resin coating, corresponding to the chemical liquid, so that they are protected from corrosion due to deposition of the chemical liquid. The chemical liquid received by the outer chamber 43 is guided to the drain 85. The drain 85 is connected to a collection line (not shown), so that the chemical liquid is collected through the collection line and is recycled or discarded (disposal of drainage).

The spin chuck 46 includes a rotary cylindrical body 62 rotatable in the horizontal direction, and an annular rotary plate 61 extending in the horizontal direction at the top of the rotary cylindrical body 62. The peripheral portion of the rotary plate 61 is provided with support pins 63 for supporting the wafer W placed thereon and pusher pins 64 for contacting and pushing the edge of the wafer W supported by the support pins 63. The wafer W is transferred between one of the transfer arms 17 and spin chuck 46 by use of the support pins 63. In order to reliably support the wafer W, the support pins 63 are preferably disposed at intervals at three or more positions in the annular direction.

The pusher pins 64 are arranged not to obstruct the operation for transferring the wafer W between the transfer arm 17 and spin chuck 46. For this purpose, a pushing mechanism (not shown) is disposed to push the portions of the pusher pins 64 below the rotary plate 61 toward the rotary plate 61, so that the upper ends (distal ends) of the pusher pins 64 are inclined out of the rotary plate 61. In order to reliably hold the wafer W, the pusher pins 64 are also preferably disposed at intervals at three or more positions in the annular direction.

A belt 65 is wound around the outer surface of the rotary cylindrical body 62 and is arranged to be driven by a motor 66. With this arrangement, the rotary cylindrical body 62 can be rotated to rotate the wafer W held by the support pins 63 and pusher pins 64 in a horizontal or almost horizontal state. The position of the barycenter of the pusher pins 64 can be adjusted, so that the pushing force on the wafer W during rotation of the wafer W is adjusted. For example, where the barycenter is set at a position below the rotary plate 61, a centrifugal force is applied to a portion below the rotary plate 61 and causes the upper end to move inward, so the pushing force on the wafer W is increased.

An under plate 48 for adjusting the temperature of the wafer W is disposed to face the back surface of the wafer W held on the spin chuck 46 and to be movable up and down. The under plate 48 is maintained at a predetermined temperature by a heater (not shown) built therein. The under plate 48 is disposed in a space on the rotary plate 61 and surrounded by the support pins 63 and pusher pins 64, and is connected to a shaft 67 extending through the rotary cylindrical body 62. The shaft 67 is connected to an elevating mechanism 69, such as an air cylinder, through a horizontal plate 68 disposed below the rotary cylindrical body 62, so that the shaft 67 is movable up and down by the elevating mechanism 69. For example, the upper surface of the under plate 48 has a plurality of process fluid supply ports 81 formed therein to supply a process fluid, such as purified water or a drying gas, toward the back surface of the wafer W. A process fluid supply passage 87 is formed in the under plate 48 and shaft 67 to supply a process fluid, such as purified water used as a temperature-adjusting fluid or nitrogen gas used as a drying gas to the process fluid supply ports 81. The process fluid supply passage 87 is provided with a heat exchanger 84 formed in the shaft 67, so that a process fluid flowing through the process fluid supply passage 87 is heated to a predetermined temperature by the heat exchanger 84 and is supplied from the process fluid supply ports 81 toward the back surface of the wafer W.

When the wafer W is transferred between the spin chuck 46 and one of the transfer arms 17, the under plate 48 is moved down to a position adjacent to the rotary plate 61 so as not to interfere with the transfer arm 17 (see the solid lines in FIG. 3). When the electroless plating process is performed on the interconnection line 102 on the wafer W held on the spin chuck 46, the under plate 48 is moved up to a position adjacent to the wafer W (see the phantom lines in FIG. 3).

The nozzle unit 51 extends in a horizontal or almost horizontal state, and a predetermined portion on the distal end side thereof (the side for delivering a plating liquid and so forth onto the wafer W) can be placed in a nozzle shed 50 formed to communicate with the outer chamber 43. The nozzle unit 51 includes a cleaning nozzle 51a, a drying nozzle 51b, and a plating liquid nozzle 51c integrated with each other. The cleaning nozzle 51a is arranged to selectively supply a chemical liquid used as a cleaning liquid, purified water used as a cleaning liquid or rinsing liquid, and nitrogen gas onto the wafer W. The drying nozzle 51b is arranged to supply nitrogen gas used as a drying gas onto the wafer W. The plating liquid nozzle 51c is arranged to supply a plating liquid onto the wafer W. The cleaning nozzle 51a, drying nozzle 51b, and plating liquid nozzle 51c are arrayed in parallel with each other in a horizontal or almost horizontal direction. The cleaning nozzle 51a, drying nozzle 51b, and plating liquid nozzle 51c respectively has nozzle tips 52a, 52b, and 52c at their distal ends bent downward. The cleaning nozzle 51a, drying nozzle 51b, and plating liquid nozzle 51c are connected to a process fluid supply mechanism 60 for supplying fluids, such as the plating liquid, cleaning liquid, and $N_2$ gas.

Figure 4:
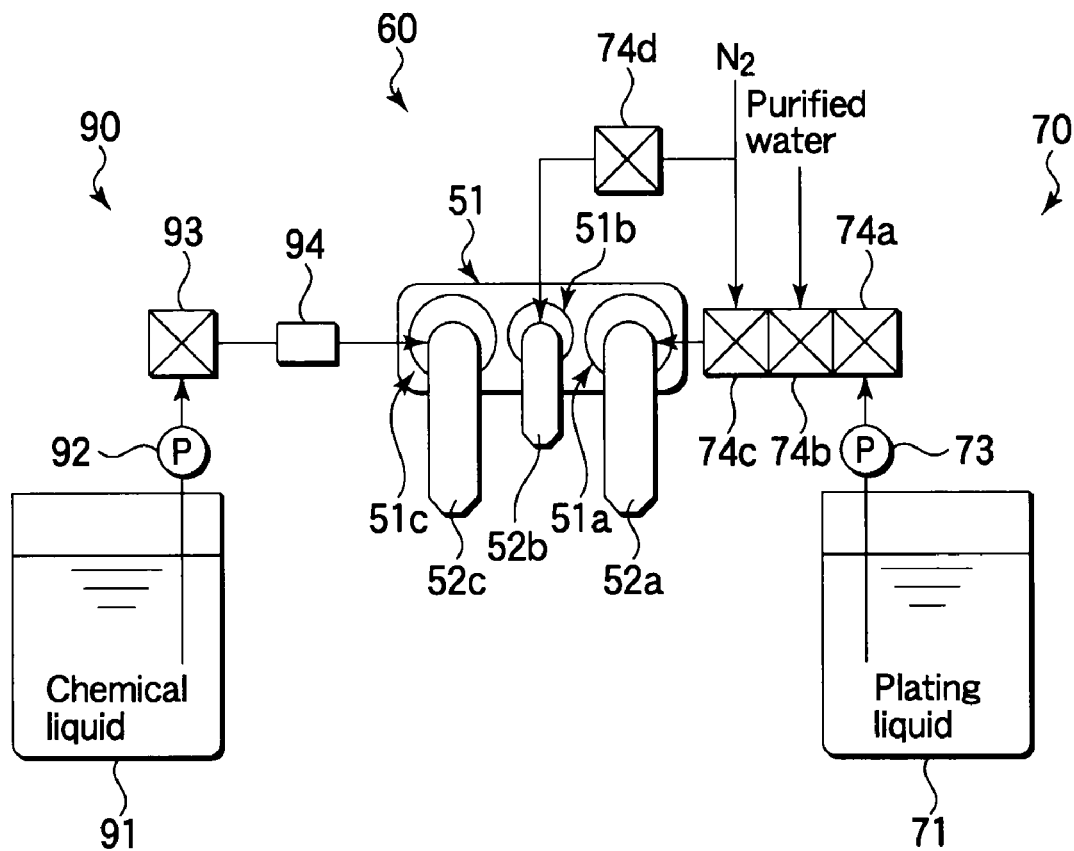
FIG. 4 This is a view schematically showing the structure of a nozzle unit and a process fluid transport mechanism for supplying process fluids, such as a plating liquid, to the nozzle unit.

FIG. 4 is a view schematically showing the structure of the nozzle unit 51 and the process fluid transport mechanism for supplying process fluids, such as a plating liquid, to the nozzle unit 51.

As shown in FIG. 4, the process fluid supply mechanism 60 includes a cleaning liquid supply mechanism 70 for supplying a chemical liquid to the cleaning nozzle 51a, and a plating liquid supply mechanism 90 for supplying a plating liquid to the plating liquid nozzle 51c.

The cleaning liquid supply mechanism 70 includes a chemical liquid storage tank 71, a pump 73, and a valve 74a. The chemical liquid storage tank 71 stores the chemical liquid while heating and adjusting it to a predetermined temperature. The pump 73 is arranged to pump up the chemical liquid from inside the chemical liquid storage tank 71. The valve 74a is arranged to switch the transportation of the chemical liquid pumped up by the pump 73 to the cleaning nozzle 51a. The cleaning nozzle 51a can be supplied not only with the chemical liquid from the cleaning liquid supply mechanism 70 but also with purified water and nitrogen gas both being heated and adjusted to a predetermined temperature. By switching the opening/closing of the valves 74a, 74b, and 74c, any one of the chemical liquid, purified water, and nitrogen gas can be selectively supplied to the cleaning nozzle 51a. For example, a common source may be used for supplying nitrogen gas to the cleaning nozzle 51a and drying nozzle 51b, while supply of nitrogen gas to the drying nozzle 51b is adjusted by opening/closing a valve 74d additionally disposed.

The plating liquid supply mechanism 90 includes a plating liquid storage tank 91, a pump 92, a valve 93, and a heating source 94. The plating liquid storage tank 91 stores the plating liquid. The pump 92 is arranged to pump up the plating liquid from inside the plating liquid storage tank 91. The valve 93 is arranged to switch the transportation of the plating liquid pumped up by the pump 92 to the plating liquid nozzle 51c. The heating source 94 is arranged to heat the plating liquid supplied through the valve 93 to the plating liquid nozzle 51c to a predetermined temperature. For example, the heating source 94 is formed of a heater or heat exchanger.

The nozzle unit 51 is held by a nozzle holder 54 having an essentially annular or cylindrical shape and provided on a wall 50a serving as the outer wall of the nozzle shed 50. The nozzle holder 54 includes three plate-like members 54a, 54b, and 54c disposed at predetermined intervals on the outer periphery, so that the nozzle holder 54 is arranged to close a through hole 57 formed in the wall 50a and to be slidable in the vertical direction. On the other hand, the through hole 57 of the wall 50a is provided with an engaging portion 50b along the edge, which engages with the plate-like members 54a, 54b, and 54c in a sealing state in the thickness direction. Since the engaging portion 50b engages with the plate-like members 54a, 54b, and 54c, the atmosphere inside the nozzle shed 50 can be hardly leaked outside.

The nozzle holder 54 is connected to a nozzle elevating mechanism 56a through an essentially L-shaped arm 55 outside the nozzle shed 50, so that the nozzle unit 51 can be moved up and down by the nozzle elevating mechanism 56a. The nozzle holder 54 includes a bellows 54d that surrounds the nozzle unit 51 inside the nozzle shed 50. The nozzle unit 51 is slidable in a horizontal direction by a nozzle slide mechanism 56b, while the bellows 54d extends/contracts along with slide of the nozzle unit 51.

The wall at the boundary between the nozzle shed 50 and outer chamber 43 has a window portion 43a formed therein, so that the nozzle unit 51 can move therethrough. The window portion 43a is provided with a door mechanism 43b for opening/closing the window portion 43a. Where the window portion 43a is set open and the nozzle unit 51 is set at a height level corresponding to the window portion 43a by the nozzle elevating mechanism 56a, the distal end side of the nozzle unit 51 can be moved into and out of the outer chamber 43 by the nozzle slide mechanism 56b.

Figure 5:
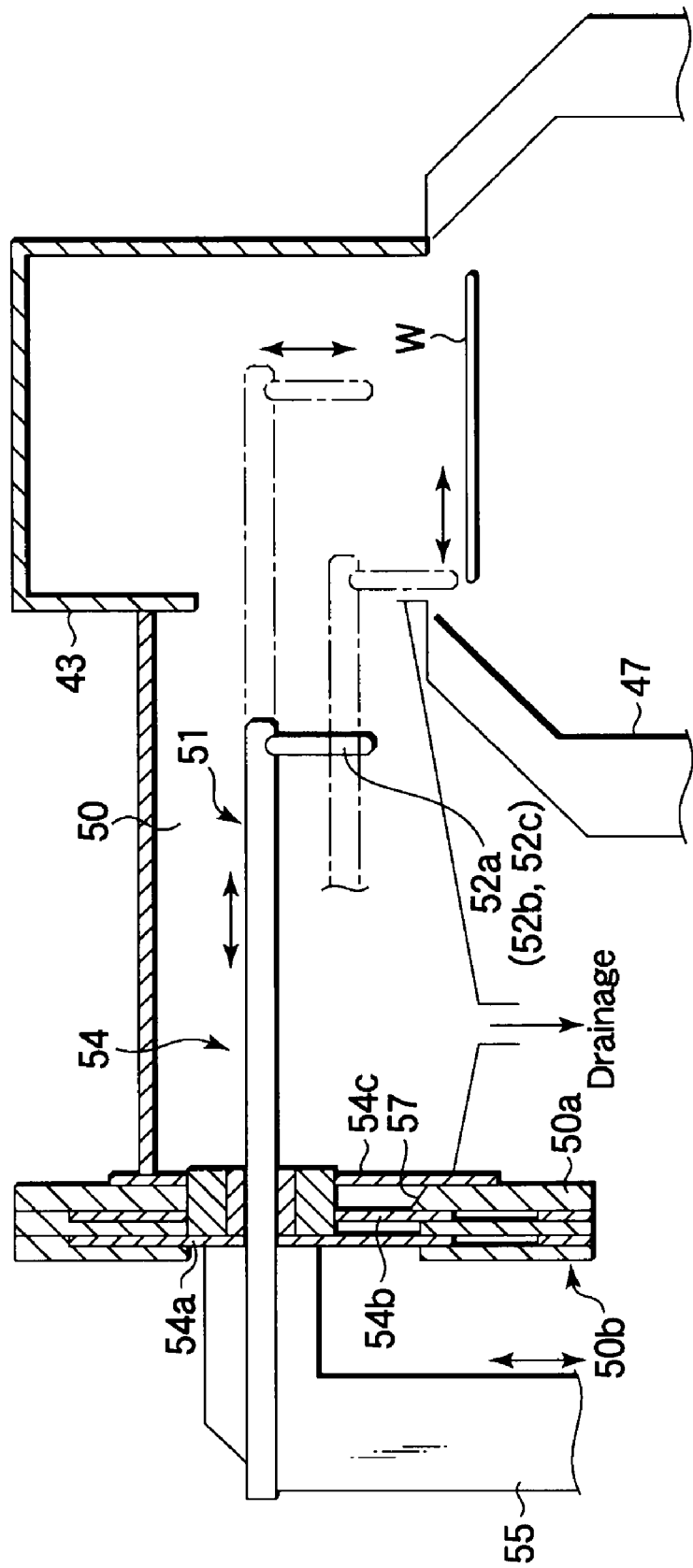
FIG. 5 This is a view for explaining the movement manner of the nozzle unit.

FIG. 5 is a view for explaining the movement manner of the nozzle unit.

As shown in FIG. 5, when the nozzle unit 51 is retreated most, the distal end side is placed inside the nozzle shed 50 (see the solid lines). On the other hand, when the nozzle unit 51 is projected most, the nozzle tips 52a, 52b, and 52c are placed essentially above the center of the wafer W (see the phantom lines). The nozzle unit 51 is moved up and down by the nozzle elevating mechanism 56a while the nozzle tips 52a, 52b, and 52c are placed inside the inner cup 47, so that the distance of the distal ends of the nozzle tips 52a, 52b, and 52c and the wafer W is adjusted. The nozzle unit 51 is moved by the nozzle slide mechanism 56b to linearly slide the nozzle tips 52a, 52b, and 52c between the essential center and peripheral edge of the wafer W, so that the plating liquid or another fluid is supplied onto a target position of the wafer W in the radial direction.

The nozzle unit 51, the inner wall of the nozzle shed 50, and other various members, such as the under plate 48, disposed inside the outer chamber 43 are also preferably provided with corrosion resistant means, such as acid and alkali resistant means, e.g., a fluorocarbon resin coating, corresponding to the chemical liquid and plating liquid. The nozzle shed 50 is preferably provided with a cleaning mechanism for cleaning the distal end side of the nozzle unit 51.

As shown in FIG. 2, the respective components of the electroless plating unit (PW) 12 are connected to and controlled by a unit controller 34 (control section) connected to the process controller 31. As needed, a required recipe is retrieved from the storage section 33 and executed by the process controller 34 in accordance with an instruction or the like input through the user interface 32.

Next, an explanation will be given of several methods according to embodiments for processing a wafer W in the electroless plating unit (PW) 12. The following explanation will be exemplified by a case where an interconnection line 102 is plated with a CoWB film as a cap metal.

Where plating of a CoWB film is performed in the electroless plating unit (PW) 12, the window portion 44a and window portion 45a are set open, and a wafer W is transferred by one of the transfer arms 17 of the main wafer transfer mechanism 18 through the window portion 44a and window portion 45a into the housing 42 and outer chamber 43. Then, the wafer W is placed on the support pins 63 of the spin chuck 46 and is held on the spin chuck 46 by the pusher pins 64 that push the edge of the wafer W. Then, the transfer arm 17 are retreated out of the housing 42, and the window portion 44a and window portion 45a are set closed by the first shutter 44 and second shutter 45. Further, the window portion 43a is set open, and the distal end side of the nozzle unit 51 is moved into the outer chamber 43 and placed above the wafer W. In this state, a process is started.

First Embodiment

Figure 7:
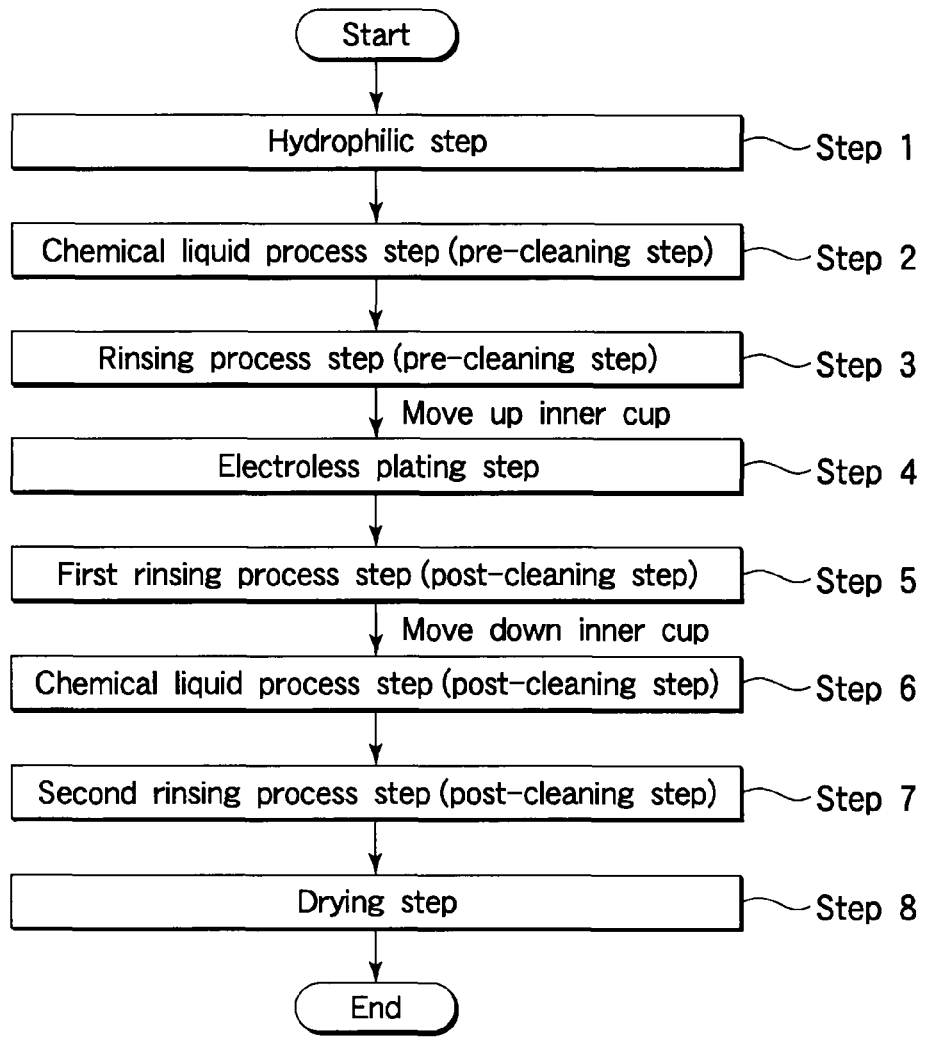
FIG. 7 This is a flow chart for explaining a substrate processing method according to a first embodiment of the present invention, performed in the electroless plating unit shown in FIGS. 2 and 3.

FIG. 7 is a flow chart showing in outline a processing method of a wafer W according to a first embodiment, performed in the electroless plating unit (PW) 12. FIG. 8A to 8D are sectional views for explaining steps of this process.

Figure 8A:
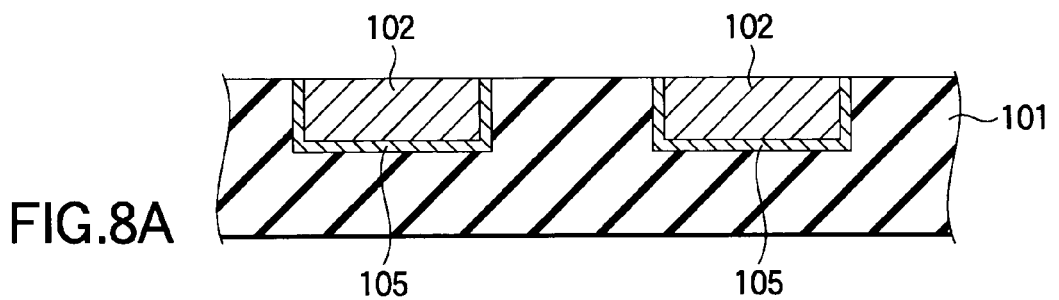
FIG. 8A This is a sectional view for explaining a step of the substrate processing method according to the first embodiment of the present invention.

At first, purified water is supplied from the cleaning nozzle 51a onto a wafer W in the state shown in FIG. 8A to perform pre-wetting of the wafer W, thereby setting the surface of the wafer W to be hydrophilic (Step 1: hydrophilic step). With this operation, a cleaning liquid used in a subsequent pre-cleaning process is prevented from being repelled on the surface of the wafer W, and a plating liquid used in electroless plating is prevented from dropping from the wafer, even where an inter-level insulating film present on the wafer surface is made of a hydrophobic material, such as a low dielectric constant film (Low-k film). For example, the pre-wetting of the wafer W is performed as follows. Specifically, a process liquid, such as purified water, is supplied onto the wafer W to form a puddle of purified water on the wafer W, while the wafer W is set in a stationary state or is slowly rotated by the spin chuck 46. This state is maintained for a predetermined time. Then, the wafer W is rotated at a predetermined rotational speed and purified water is supplied onto the wafer W, while the nozzle unit 51 is moved for the nozzle tip 52a of the cleaning nozzle 51a to linearly scan the portion between the center and peripheral edge of the wafer W. In the cleaning process, rinsing process, and electroless plating process described later, the same method as that of the pre-wetting can be used, while the rotational speed of the wafer W is suitably selected in accordance with the process conditions of the cleaning process, electroless plating process, and so forth.

The hydrophilic process performed by this pre-wetting also serves to remove contaminants on the surface of the wafer W and to remove bubbles easily generated at the interface between liquid and solid. In this case, the delivery flow rate of purified water is preferably adjusted in accordance with the hydrophobic level of the surface of the wafer W, such that the delivery flow rate is set larger with a higher hydrophobic level. The rotational speed of the wafer W is also preferably adjusted in accordance with the hydrophobic level, such that the rotational speed is set lower with a higher hydrophobic level. The process time is also preferably adjusted in accordance with the hydrophobic level of the wafer surface.

After the pre-wetting of the wafer W is finished and purified water deposited on the wafer W is thrown off to some extent by rotation of the spin chuck 46, a chemical liquid used as a cleaning liquid is supplied from the cleaning nozzle 51a onto the wafer W to perform a chemical liquid process as a pre-cleaning process of the wafer W (Step 2: chemical liquid process step (pre-cleaning step)). With this operation, the Cu oxide film and contaminants are removed from the surface of the interconnection line 102 formed on the wafer W. The chemical liquid used in this step is not limited to a specific one and it may be a chemical liquid commonly used. However, in order to enhance the effect of removing the Cu oxide film from the surface of the interconnection line 102, an organic acid aqueous solution may be used, for example. Specifically, where an organic acid is used for the pre-cleaning, the copper oxide is removed from the copper interconnection line without causing corrosion, so that the nucleus formation density is increased in the subsequent plating process, and the surface morphology is thereby improved. At this time, the chemical liquid received by the outer chamber 43 is collected through the drain 85.

This chemical liquid process step serving as a pre-cleaning step is preferably performed while the wafer surface is kept wetted. With this operation, purified water on the wafer surface is efficiently replaced with the chemical liquid, and the cleaning effect of the chemical liquid is improved. The chemical liquid process step serving as a pre-cleaning step is performed while the chemical liquid is supplied at a flow rate set to efficiently remove a Cu oxide protection film, a Cu oxide film, and/or metal components remaining between interconnection lines. At this time, the rotational speed of the wafer W needs to be suitably set, because an excessively low speed deteriorates the removal efficiency, while an excessively high speed causes the wafer W to be at least partly dried and deteriorates the morphology of the plated film due to re-oxidation of the Cu surface. The process time is preferably set to be about 10 to 60 seconds, because an excessively long process time causes Cu used as the metal of the interconnection line to be dissolved too much, and brings about problems, such as an increase in the resistivity of the interconnection line.

Then, purified water is supplied from the cleaning nozzle 51a onto the wafer W, to perform a rinsing process as a pre-cleaning step on the wafer W by use of purified water (Step 3: rinsing process step (pre-cleaning step)). This rinsing process step is performed to replace the chemical liquid with purified water to prevent the following problem. Specifically, where the chemical liquid, which is acidic, remains on the surface of the wafer W after the chemical liquid cleaning, the chemical liquid is mixed with the plating liquid, which is alkaline, used in a subsequent step. Consequently, a neutralization reaction is caused, so the pH of the plating liquid is changed and particles are generated, thereby bringing about plating faults. Further, the rinsing process step needs to be performed to prevent the surface of the wafer W from being dried, because Cu is oxidized if the wafer W is dried.

In the rinsing process of the wafer W or after the rinsing process, the under plate 48 is moved up to a position near the wafer W. Then, purified water heated at a predetermined temperature is supplied from the process fluid supply ports 81 to heat the wafer W to a predetermined temperature.

Figure 8B:
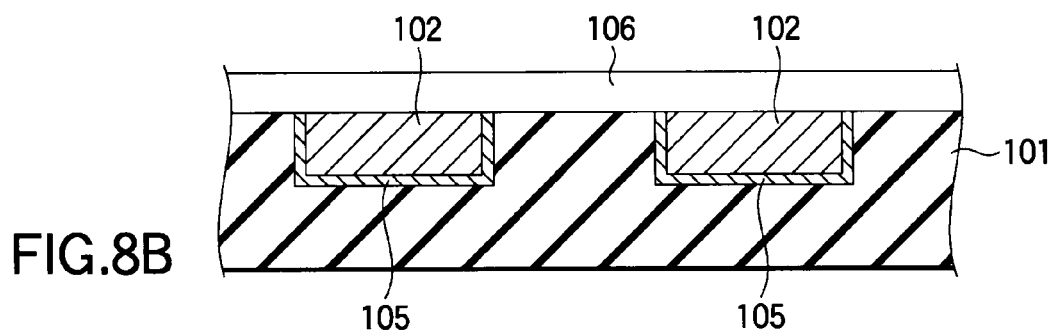
FIG. 8B This is a sectional view for explaining a step of the substrate processing method according to the first embodiment of the present invention.
Figure 8C:
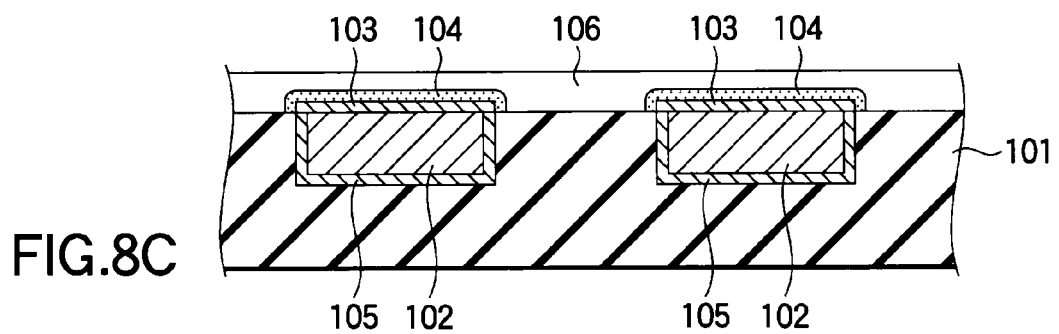
FIG. 8C This is a sectional view for explaining a step of the substrate processing method according to the first embodiment of the present invention.

After the rinsing process of the wafer W is finished and purified water deposited on the wafer W is thrown off to some extent by rotation of the spin chuck 46, the inner cup 47 is moved up to the process position. Then, as shown in FIG. 8B, a plating liquid 106 heated at a predetermined temperature by the heating source 94 is supplied, from the plating liquid nozzle 51c set at a predetermined position above the wafer W, onto the wafer W (insulating film 101) heated at a predetermined temperature to perform an electroless plating process on the interconnection line 102 (Step 4: electroless plating step). With this operation, as shown in FIG. 8C, CoWB of the plating liquid 106 is precipitated on the surface of the interconnection line 102 (including the barrier metal 105), so the interconnection line 102 is covered with a CoWB film 103 (cap metal).

In this electroless plating process, while the wafer W is rotated at about 100 rpm, the plating liquid is supplied onto the wafer W to replace the rinsing liquid (purified water) present on the wafer W with the plating liquid. Thereafter, the rotational speed of the wafer W is decreased to a very low value to pool the plating liquid on the wafer W. Then, while the wafer W is kept rotated at the very low speed, the plating liquid is supplied to promote the plating process, so as to form the CoWB film 103.

Immediately after the CoWB film 103 is formed, a slurry-like by-product 104 generated by the plating reaction is present on the surface of the CoWB film 103. The plating liquid received by the inner cup 47 during the electroless plating process is collected through the drain 88.

The plating liquid used in the electroless plating process is not limited to a specific one, and it may be a plating liquid commonly used. For example, the plating liquid may be prepared such that it contains, as main components, a Co-containing salt, such as cobalt chloride, a W-containing salt, such as tungsten acid ammonium, and a reducing agent, such as dimethylamineborane (DMAB), which is a derivative of sodium borohydride (SBH), and further contains, as auxiliary components, a complexing agent, a pH-adjusting agent, a buffering agent, and so forth. The plating liquid preferably contains a surfactant, which is not limited to an acidic or alkali surfactant, but is preferably an anionic, nonionic, ampho-ionic, cationic, or polymer surfactant. Where a plating liquid containing such a surfactant is used, the effect of removing the by-product 104 present on the surface of the CoWB film 103 is enhanced by the surface-activation effect of the surfactant in a post-cleaning process described below.

In the electroless plating process step, the rinsing liquid (purified water) remaining on the surface of the wafer W needs to be replaced in a short time, so the wafer W is preferably rotated at a rotational speed that realizes replacement in a predetermined time. However, if the rotational speed of the wafer W is too high, the wafer can be easily dried due to a high viscosity of the plating liquid, and may deteriorate the morphology or bring about plating faults. Since the plating liquid needs to be uniformly pooled all over the surface of the wafer W after purified water used as the rinsing liquid is replaced with the plating liquid, the rotational speed is preferably lower. However, it is not preferable to set the rotational speed at zero, because the frequency of supplying the plating liquid to the peripheral portion of the wafer W becomes too low and the wafer W may be thereby dried. Where the wafer W is kept rotated after the liquid pooling, the thermal influence from the backside of the wafer W is uniformized, so that the planar uniformity in plating rate is improved.

Since the plating liquid pooled on the wafer W is discharged through the peripheral portion of the spin chuck 46 and/or wafer W, the surface of the wafer W may thereby be dried and deteriorate the morphology. Accordingly, the plating liquid is preferably supplied during the plating process. Further, when the liquid on the surface of the wafer W is replaced with the plating liquid to start the plating process, the temperature of the wafer W needs to be set at the precipitation temperature of CoWB. If the precipitation cannot be promoted due to an excessively low temperature, the alkali plating liquid may cause hydroxylation of the surface of the Cu interconnection line, which inhibits the plating even if the temperature is increased thereafter. In order to solve this problem, warmed purified water is preferably supplied onto the wafer back surface to heat the wafer W before the start of the plating.

After the electroless plating process is finished, the supply of warmed purified water from the process fluid supply ports 81 is stopped. Then, purified water is supplied from the cleaning nozzle 51a onto the wafer W to perform a rinsing process as post-cleaning of the wafer W (Step 5: first rinsing process step (post-process step). With this operation, the excess part of the plating liquid 106 deposited on portions of the wafer W other than the interconnection line 102 is partly or mostly removed, and the part of the plating liquid deposited on the inner wall of the inner cup 47 is also removed. On the other hand, the by-product 104 present on the surface of the CoWB film 103 should be removed as soon as possible, because the by-product 104 has a high viscosity and is dried with a lapse of time to be a precipitated substance strongly sticking to the CoWB film 103. This rinsing process prevents the by-product 104 from being dried, and thereby delays precipitation of the by-product 104. At this time, the rotational speed of the wafer W needs to be set at a suitable value, because an excessively high rotational speed causes the surface of the wafer W to be partly dried, thereby decreasing the efficiency of the post-cleaning in removing residues generated by the plating process. The supply of purified water from the process fluid supply ports 81 may be stopped after the rinsing process.

In the rinsing process of the wafer W or after the rinsing process, the inner cup 47 is moved down to the retreat position. Where the inner cup 47 is moved down in the rinsing process, purified water for the rinsing process thrown off from the wafer W can be sprayed onto the inner cup 47 to scan it from the lower side to the upper side, so that the entire inner wall of the inner cup 47 is efficiently washed out.

Figure 8D:
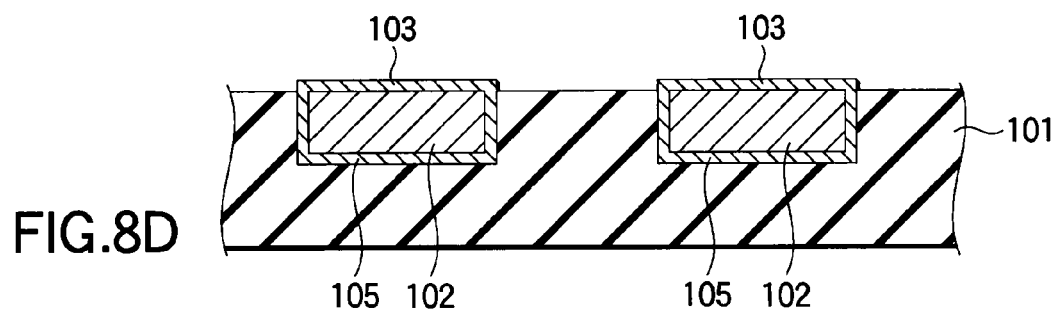
FIG. 8D This is a sectional view for explaining a step of the substrate processing method according to the first embodiment of the present invention.

After the rinsing process is finished, a chemical liquid is supplied as a cleaning liquid from the cleaning nozzle 51a onto the wafer W to perform a chemical liquid process as a post-cleaning process of the wafer W (Step 6: chemical liquid process step (post-cleaning step)). This chemical liquid process is arranged to remove residues generated by the plating precipitation reaction and to remove plated films abnormally precipitated between lines. The chemical liquid process is preferably performed while the wafer surface is not dried but kept wetted. If the wafer surface is dried, precipitated substances generated by the plating process can easily remain on the wafer surface and deteriorate the cleaning effect. In this embodiment, this chemical liquid process can be started at a very short interval that is defined by a switching time of valves from purified water for the rinsing process to the cleaning liquid for the post-cleaning process, after the rinsing process described above. Consequently, this process can be performed before the plated surface is dried, i.e., before the by-product 104 is dried to be a precipitated substance strongly sticking to the surface of the CoWB film 103. In other word, as shown in FIG. 8D, the by-product 104 is reliably removed by this chemical liquid process, when the sticking force thereof to the CoWB film 103 is still weak. Further, the residues of the excess part of the plating liquid 106 deposited on the wafer W are also removed by this post-cleaning process to prevent contamination. If the wafer W is dried, the post-cleaning effect is deteriorated, because by-products (residues) generated by the plating process can easily remain on the surface of the wafer W and strongly stick to the surface.

In the chemical liquid process, the cleaning liquid received by the outer chamber 43 and the outer wall of the tapered portion 47a of the inner cup 47 is collected through the drain 85. In this embodiment, a rinsing process is performed before the chemical liquid process, so that the excess part of the plating liquid 106 deposited on portions of the wafer W other than the interconnection line 102 is partly or mostly removed. Consequently, the chemical liquid is collected in a state having a high purity, so the chemical liquid can be recycled.

The chemical liquid (cleaning liquid) used in the chemical liquid process is not limited to a specific one and it may be a chemical liquid commonly used. However, an acidic liquid is preferably used, because an acidic cleaning liquid can enhance the effect of dissolving the by-product 104 by acid, thereby removing the by-product 104 more effectively. However, where the chemical liquid is strong acid with a pH of less than 3, the liquid may infiltrate into the portion between the interconnection line 102 and barrier metal 105 and cause galvanic corrosion (corrosion due to contact between heterogeneous metals). Further, in this case, the adhesive property of particles relative to the wafer may become stronger and thereby decrease the process yield. Accordingly, the chemical liquid is preferably an acid with a pH of 3 or more, and more preferably with a pH of 3 to 4, such as diluted sulfuric acid.

Where the chemical liquid is an acid with a pH of 3 to 4, the by-product 104 can be dissolved and removed from the surface of the CoWB film 103 by an acid of the chemical liquid, even if the by-product 104 has a high adhesive property relative to the surface of the CoWB film 103.

In an experiment, the chemical liquid process was performed on a by-product deposited on the surface of a CoWB film, by use of chemical liquids with pH 3, pH 4, and pH 5, respectively, to confirm whether the by-product was removed from the surface of the CoWB film. As a result, it was confirmed that, where the chemical liquid with pH 5 was used, the by-product was not sufficiently removed, while, where the chemical liquids with pH 3 and pH 4 were used, the by-product was removed (see Table 1).

TABLE 1

| Cleaning liquid pH | Removal of by-product |
| --- | --- |
| 3 | ○ (Complete) |
| 4 | ○ (Complete) |
| 5 | Δ (Insufficient) |

Figure 9:
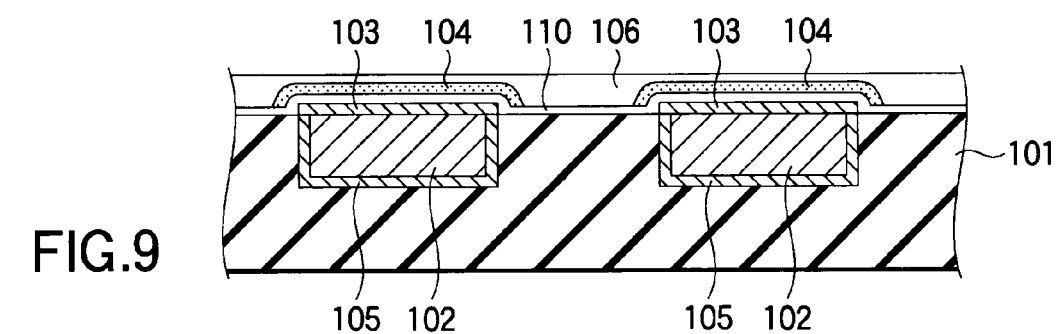
FIG. 9 This is a sectional view showing a wafer for explaining a modification of the substrate processing method according to the first embodiment of the present invention.

The chemical liquid used in the chemical liquid process serving as a post-cleaning process is preferably contains a surfactant. In this case, as shown in FIG. 9, the chemical liquid process is performed such that a surfactant layer 110 is present between the CoWB film 103 and by-product 104 and peels off the by-product 104 by its surface-activation effect, thereby removing the by-product 104 more effectively (the surfactant layer 110 is removed along with the by-product 104). Further, where the chemical liquid for the post-cleaning process contains a surfactant, the chemical liquid has high wettability relative to the surface of the wafer W and thereby prevents the surface of the wafer W from being dried.

Particularly, where the cleaning liquid has a surfactant concentration of 0.0001% or more, the by-product 104 is peeled off and removed from the surface of the CoWB film 103 by the surface-activation effect of the surfactant, even if the by-product 104 has a high adhesive property relative to the surface of the CoWB film 103.

Where the cleaning liquid is acidic particularly with a pH of 3 to 4 and contains a surfactant particularly in a concentration of 0.0001% or more, the dissolution effect of the acid is combined with the peeling effect of the surfactant, thereby providing a further enhanced effect.

In an experiment, the cleaning process was performed on a by-product deposited on the surface of a CoWB film, by use of cleaning liquids with surfactant concentrations of 0.001%, 0.0001%, and 0.00001%, respectively, to confirm whether the by-product was removed from the surface of the CoWB film. As a result, it was confirmed that, where the cleaning liquid with a surfactant concentration of 0.00001% was used, the by-product was not sufficiently removed, while, where the cleaning liquids with surfactant concentrations of 0.001% and 0.0001% were used, the precipitated substance was removed (see Table 2). As the surfactant, RS-710 (manufactured by TOHO Chemical Industry Co., LTD) was used, and DIW was added thereto to dilute the surfactant to a target concentration.

TABLE 2

| Surfactant concentration (%) | Removal of by-product |
| --- | --- |
| 0.001% | ○ (Complete) |
| 0.0001% | ○ (Complete) |
| 0.00001% | Δ (Insufficient) |

Where the cleaning liquid is acidic particularly with a pH of 3 to 4 and contains a surfactant particularly in a concentration of 0.0001% or more, the dissolution effect of the acid is combined with the peeling effect of the surfactant, thereby providing a further enhanced effect.

As described above, where a plating liquid containing a surfactant is used in the electroless plating process, as shown in FIG. 9, the post-cleaning process is performed such that a surfactant layer 110 is present between the CoWB film 103 and by-product 104 and peels off the by-product 104 by its surface-activation effect, thereby removing the by-product 104 more effectively. Further, in this case, the surfactant prevents the plating liquid from bubbling and improves the wettability of the plating liquid.

After the chemical liquid process step serving as a post-cleaning process of the wafer W is finished, purified water is supplied from the cleaning nozzle 51a onto the wafer W to perform a rinsing process of the wafer W (Step 7; second rinsing process). In this rinsing process or after this rinsing process, the under plate 48 is moved down and separated from the wafer W.

After the second rinsing process is finished, the wafer W is rotated by the spin chuck 46, and nitrogen gas is supplied from the cleaning nozzle 51a onto the wafer W to dry the wafer W (Step 8). The drying process of the wafer W is arranged such that nitrogen gas is supplied onto the back surface of the wafer W from the process fluid supply ports 81 of the under plate 48 that has been moved down, and then the under plate 48 is moved up to be close to the wafer W again. Further, for example, this drying process may be performed such that the wafer W is rotated at a low rotational speed for a predetermined time and then rotated at a high rotational speed for a predetermined time.

After the drying process of the wafer W is finished, the nozzle unit 51 is moved to a predetermined height by the nozzle elevating mechanism 56a, as needed, then the distal end side of the nozzle unit 51 is moved into the nozzle shed 50 by the nozzle slide mechanism 56b, and then the window portion 43a is closed. Then, the under plate 48 is moved down and separated from the wafer W, and the wafer W is released from the pushing force of the pusher pins 64 and is supported only by the support pins 63, while the window portion 44a and window portion 45a are opened. Thereafter, one of the transfer arms 17 is moved into the outer chamber 43, receives the wafer W from the support pins 63, and transfers it outside.

In the electroless plating unit (PW) 12, the electroless plating process of the interconnection line 102 formed on the wafer W and the cleaning process (post-cleaning process) of the wafer W after this electroless plating process can be performed at the same site without transferring the wafer W. In this case, the by-product 104 can be removed by the post-cleaning process, before the by-product 104 turns into a precipitated substance on the surface of the CoWB film 103 formed by the electroless plating process to cover the interconnection line 102.

It is often the case that a plating liquid used for an electroless plating process differs from a cleaning liquid used for a post-cleaning process, such that the plating liquid is alkaline and the cleaning liquid is acidic. Conventionally, this difference makes it difficult to perform the electroless plating process and post-cleaning process in the same unit, due to, e.g., the corrosion resistant relative to the plating liquid and cleaning liquid. Accordingly, it takes a long time to start the post-cleaning process after the electroless plating process is finished, because a wafer W needs to be transferred after the electroless plating process from an electroless plating unit to a cleaning unit to perform the post-cleaning process. Further, in order to prevent a transfer mechanism for transferring the wafer W from being contaminated by the plating liquid and so forth, the wafer W needs to be dried after the electroless plating process and before the post-cleaning process. Consequently, a by-product turns into a precipitated substance on the surface of a CoWB film formed by the electroless plating process before the post-cleaning process, wherein this precipitated substance is very difficult to remove by the post-cleaning process.

In light of the problem described above, the electroless plating unit (PW) 12 according to this embodiment includes the outer chamber 43 and the inner cup 47 movable up and down inside the outer chamber 43. When the electroless plating process is performed, the plating liquid thrown off from the wafer W is received by the inner cup 47. When the post-cleaning process is performed, the cleaning liquid thrown off from the wafer W is received by the outer chamber 43. Where the plating liquid and cleaning liquid have different natures, the inner cup 47 and outer chamber 43 are provided with corrosion resistant means corresponding to the plating liquid and cleaning liquid, respectively, so that they are prevented from being corroded by deposition of the plating liquid and cleaning liquid. Further, the alkaline plating liquid and the acidic cleaning liquid are separately collected or discharged, so that the electroless plating process and post-cleaning process can be sequentially performed while the wafer W is kept held on the spin chuck 46. Specifically, when the post-cleaning process is performed after the electroless plating process, the wafer W does not need to be transferred, and thus the electroless plating process and post-cleaning process can be performed at a short interval. Accordingly, the post-cleaning process can be performed before the plated surface is dried, to effectively remove the by-product 104 on the surface of the CoWB film 103, thereby improving the quality of the CoWB film 103 serving as a cap metal.

As in the electroless plating process, the hydrophilic process and pre-cleaning process before the plating process are performed by use of the spin chuck 46, so the pre-cleaning process and electroless plating process can be performed at a short interval while the wafer surface is not dried but kept wetted. Where the wafer W is prevented from being dried also before the plating process, the pre-cleaning is efficiently performed, and Cu re-oxidation is restrained so as not to deteriorate the morphology of the plated film, as described above.

As described above, the post-cleaning is preferably performed on the wafer W by use of a cleaning liquid before the plated surface formed by the electroless plating is dried. In addition, the plating process is preferably performed before the surface of the wafer W is dried after the pre-cleaning. Most preferably, the processes from the pre-wetting process (hydrophilic process) to the drying process are performed while the wafer is kept wetted. With this arrangement, a series of processes is completed without causing problems due to the surface of the wafer W being dried.

As described above, the post-cleaning process may employ an acidic cleaning liquid particularly with a pH of 3 to 4. Alternatively, the post-cleaning process may employ a cleaning liquid containing a surfactant and particularly acidic or neutral with a surfactant concentration of 0.0001% or more. Further, the electroless plating process may employ a plating liquid containing a surfactant. In any of these cases, the effect of removing the by-product 104 is very high in the post-cleaning process, so the post-cleaning process can be shortened and the cleaning liquid consumption can be decreased.

After the post-cleaning process, back surface cleaning and end surface cleaning may be performed on the wafer. In the back surface cleaning and end surface cleaning, the rotational speed of the wafer is first increased to dry the process target surface of the wafer. This is conceived to prevent a back surface cleaning liquid from flowing onto the wafer front surface. Then, the back surface cleaning is performed. In the back surface cleaning, while the wafer W is rotated at a low speed, purified water is supplied onto the wafer back surface to perform a hydrophilic process on the wafer back surface, so that a back surface cleaning liquid can be uniformly spread on the wafer back surface. Then, a chemical liquid for the back surface cleaning is supplied onto the wafer back surface to remove residues deposited on the back surface during the plating process. Thereafter, the end surface cleaning is performed. In the end surface cleaning, purified water is supplied on the wafer back surface, and is kept supplied in the subsequent steps. Then, while purified water is supplied onto the wafer center, the back surface nozzle is placed at the wafer peripheral edge and is used to perform the end surface cleaning by use of the back surface cleaning liquid (chemical liquid). Thereafter, the back surface cleaning liquid is stopped, and only purified water is supplied to perform a rinsing process.

Where the back surface cleaning and end surface cleaning are performed, a drying step is performed thereafter.

Second Embodiment

Figure 10:
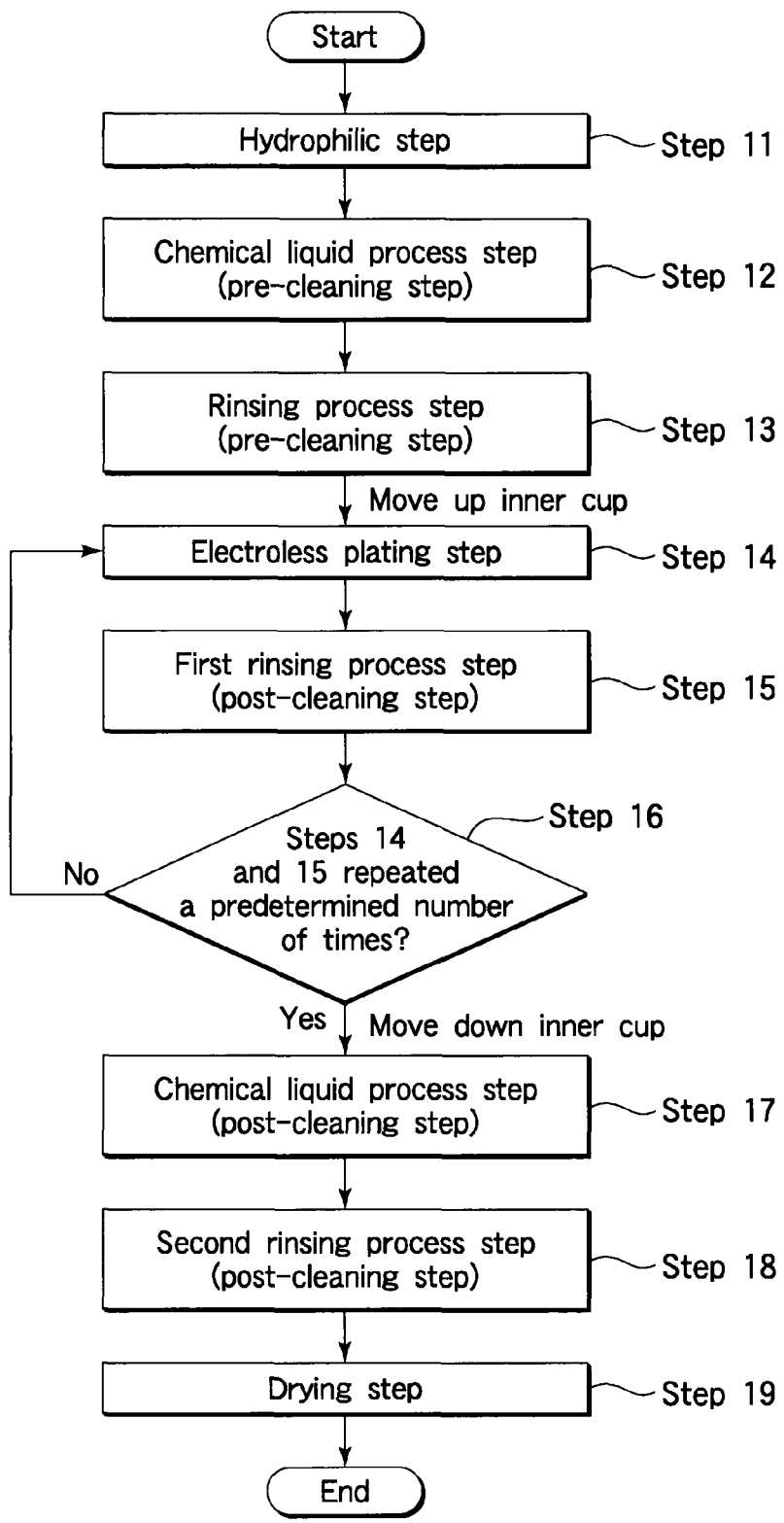
FIG. 10 This is a flow chart for explaining a substrate processing method according to a second embodiment of the present invention, performed in the electroless plating unit shown in FIGS. 2 and 3.

FIG. 10 is a flow chart showing in outline a processing method of a wafer W according to a second embodiment, performed in the electroless plating unit (PW) 12. FIG. 11A to 11E are sectional views for explaining steps of this process.

At first, purified water is supplied from the cleaning nozzle 51a onto a wafer W in the state shown in FIG. 8A to perform pre-wetting of the wafer W, thereby setting the surface of the wafer W to be hydrophilic (Step 11: hydrophilic step). With this operation, the wettability of the surface of the wafer W is improved. The pre-wetting of the wafer W is performed in the same way as that of the first embodiment. Specifically, for example, a process liquid, such as purified water, is supplied onto the wafer W to form a puddle of purified water on the wafer W, while the wafer W is rotated by the spin chuck 46. This state is maintained for a predetermined time. Then, the wafer W is rotated at a predetermined rotational speed and purified water is supplied onto the wafer W, while the nozzle unit 51 is moved for the nozzle tip 52a of the cleaning nozzle 51a to linearly scan the portion between the center and peripheral edge of the wafer W. At this time, the rotational speed of the wafer W is suitably selected in accordance with the process conditions of the cleaning process, electroless plating process, and so forth. As in the first embodiment, the cleaning processes using a chemical liquid and purified water and electroless plating process may be performed in the same way, while the rotational speed of the wafer W is suitably selected in accordance with the process conditions of the cleaning process, electroless plating process, and so forth.

After the hydrophilic step (pre-wetting) of the wafer W is finished and purified water deposited on the wafer W is thrown off to some extent by rotation of the spin chuck 46, a chemical liquid is supplied from the cleaning nozzle 51a onto the wafer W to perform a chemical liquid process as a pre-cleaning process (Step 12: chemical liquid process step (pre-cleaning step)). With this operation, the Cu oxide film and contaminants are removed from the surface of the interconnection line 102 formed on the wafer W. This step is performed essentially in the same way as that of the first embodiment. Further, the chemical liquid used in this step is not limited to a specific one and it may be a chemical liquid commonly used, as in the first embodiment. However, in order to enhance the effect of removing the Cu oxide film from the surface of the interconnection line 102, an organic acid aqueous solution may be used, for example. Further, the chemical liquid process step is preferably performed while the wafer surface is kept wetted, as in the first embodiment.

After the chemical liquid cleaning step is finished, purified water is supplied from the cleaning nozzle 51a onto the wafer W, to perform a rinsing process as cleaning or rinsing of the wafer W by use of purified water (Step 13: rinsing process step (pre-cleaning step)). With this operation, the chemical liquid deposited on the wafer W is removed, and the chemical liquid deposited on the outer chamber 43 is also washed out. This rinsing process is performed in the same way as that of the first embodiment, and is preferably performed to prevent the surface of the wafer W from being dried, because Cu is oxidized if the wafer W is dried, as in the first embodiment. In the cleaning of the wafer W by use of purified water or after the cleaning, the under plate 48 is moved up to a position near the wafer W, as in the first embodiment. Then, purified water heated at a predetermined temperature is supplied from the process fluid supply ports 81 to heat the wafer W to a predetermined temperature.

After the cleaning process using purified water is finished and purified water deposited on the wafer W is thrown off to some extent by the centrifugal force of rotation of the spin chuck 46, the inner cup 47 is moved up to the process position. Then, as shown in FIG. 8B, a plating liquid 106 heated at a predetermined temperature by the heating source 94 is supplied from the plating liquid nozzle 51c onto the wafer W heated at a predetermined temperature to perform an electroless plating process on the interconnection line 102 (Step 14: electroless plating step). For example, the plating liquid used in this step may be prepared as in the first embodiment such that it contains, as main components, a Co salt, such as cobalt chloride, a W salt, such as tungsten acid ammonium, and a reducing agent, such as dimethylamineborane (DMAB), which is a derivative of sodium borohydride (SBH), and further contains, as auxiliary components, a complexing agent, a pH-adjusting agent, a buffering agent, and so forth. With this electroless plating, as shown in FIG. 8C, CoWB of the plating liquid 106 is precipitated on the surface of the interconnection line 102, so the interconnection line 102 is covered with a CoWB film 103. The plating liquid received by the inner cup 47 during the electroless plating process is collected through the drain 88.

After the electroless plating process of the interconnection line 102 is finished, the supply of warmed purified water from the process fluid supply ports 81 is stopped. Then, purified water is supplied from the cleaning nozzle 51a onto the wafer W to perform a rinsing process as post-cleaning of the wafer W (Step 15: first rinsing process step (post-process step)). With this operation, the excess part of the plating liquid 106 deposited on portions of the wafer W other than the interconnection line 102 is partly or mostly removed, and the part of the plating liquid deposited on the inner wall of the inner cup 47 is also removed. The supply of purified water from the process fluid supply ports 81 may be stopped after the rinsing process.

Figure 11A:
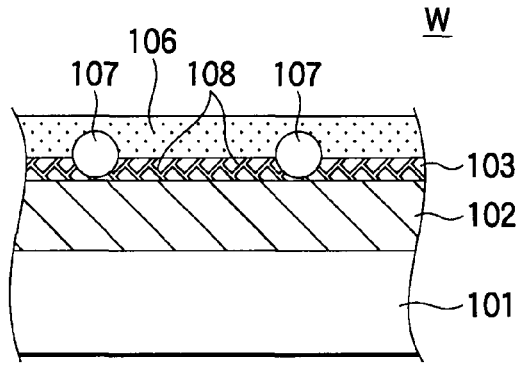
FIG. 11A This is a sectional view for explaining a step of the substrate processing method according to the second embodiment of the present invention.
Figure 11D:
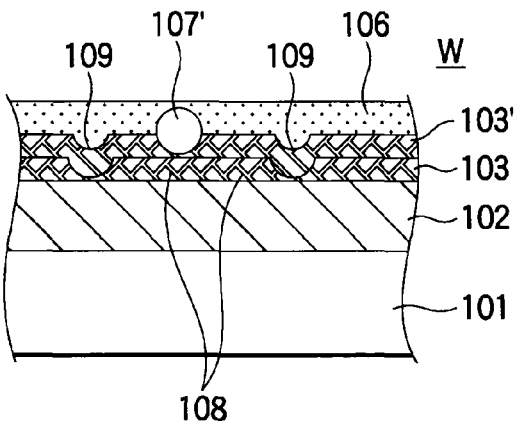
FIG. 11D This is a sectional view for explaining a step of the substrate processing method according to the second embodiment of the present invention.
Figure 11B:
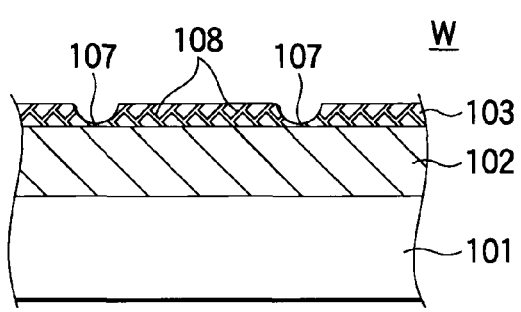
FIG. 11B This is a sectional view for explaining a step of the substrate processing method according to the second embodiment of the present invention.

In the electroless plating step of Step 14 described above, hydrogen gas is generated due to decomposition of the reducing agent contained in the plating liquid 106 when the plating reaction is caused. Consequently, as indicated in the enlarged view of FIG. 11A showing a portion corresponding to the interconnection line 102, voids 107 are formed in the CoWB film 103 by the hydrogen gas bubbles, and damage the continuity of the CoWB film 103 at this time. Further, voids may be formed due to bubbling of gas dissolved in the plating liquid, thereby damaging the continuity of the CoWB film 103. Where the rinsing process of Step 15 described above is performed in this state, the rinsing process can not only remove the excess part of the plating liquid 106 as described above, but also remove hydrogen gas adsorb on the CoWB film 103, which is a cause of the voids 107, as shown in FIG. 11B.

However, some voids 107 in the CoWB film 103 are still left, and Cu of the interconnection line 102 may be diffused from these voids 107.

In light of this, according to this embodiment, the electroless plating step of Step 14 described above and the first rinsing step of Step 15 serving as the post-process step described above are repeated a predetermined number of times (Step 16). For this purpose, the unit controller 34 is used to make a judgment of whether or not Steps 14 and 15 have been repeated a predetermined number of times.

Figure 11E:
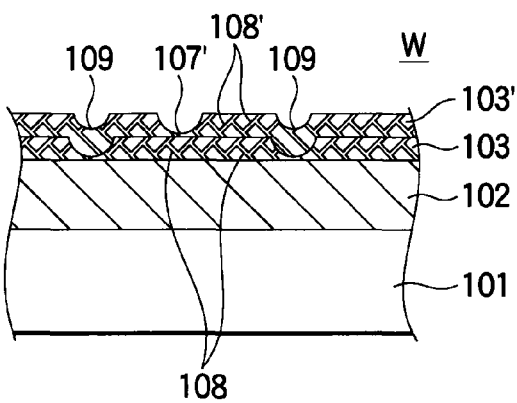
FIG. 11E This is a sectional view for explaining a step of the substrate processing method according to the second embodiment of the present invention.
Figure 11C:
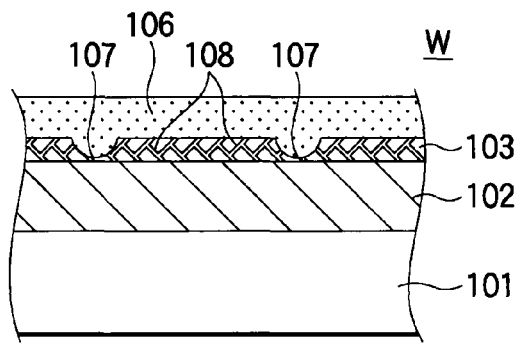
FIG. 11C This is a sectional view for explaining a step of the substrate processing method according to the second embodiment of the present invention.

When the electroless plating step of Step 14 is performed again, the plating liquid 106 is supplied onto the CoWB film 103 and forms a state shown in FIG. 11C. When the electroless plating process is performed for the first time, the CoWB film 103 includes voids 107 formed therein, so Cu of the interconnection line 102 may be diffused from these voids 107. On the other hand, when the plating liquid 106 is supplied on the CoWB film 103 for the second time, a CoWB film 103' is formed on the surface of the CoWB film 103, as show in FIG. 11D, so that the voids 107 formed in the CoWB film 103 are filled with part of the CoWB film 103'. Further, even where voids formed by bubbling of gas dissolved in the plating liquid are present in the CoWB film 103, these voids are filled with part of the CoWB film 103'. Further, since the CoWB film 103 is poly-crystalline and thus has crystal grain boundaries, Cu may be diffused from pinholes 108 at the crystal grain boundaries. Where the plating step is repeatedly performed, the openings of the pinholes 108 formed at the crystal grain boundaries of the CoWB film 103 are also filled with the CoWB film 103'.

Accordingly, the barrier property of the CoWB film is improved to prevent Cu diffusion. Further, recessed portions 109 may be formed in the CoWB film 103' at positions corresponding to the voids 107 of the CoWB film 103, but the recessed portions 109 are sufficiently smaller than the voids 107 and do not damage the quality of the CoWB film. Further, pinholes 108' are also formed in the CoWB film 103' at the crystal grain boundaries, but the pinholes 108' are very unlikely to communicate with the pinholes 108 at the crystal grain boundaries of the CoWB film 103.

The CoWB film 103' includes voids 107' formed therein due to hydrogen gas, so the first rinsing step (Step 15) is performed again after this electroless plating step is finished. Consequently, as shown in FIG. 11E, hydrogen gas is removed from inside the voids 107' along with the plating liquid 106.

As described above, the electroless plating step of the interconnection line 102 (Step 14) and the cleaning of the wafer W by use of purified water (Step 15) are repeated a plurality of times. Consequently, voids formed by hydrogen gas and pinholes at crystal grain boundaries, which may cause Cu diffusion, are closed, and hydrogen gas adsorb on the CoWB film is removed, while the cap metal is formed.

The number of repetitions is preferably set to be 2 to 10, so that the plating process is performed in a practical period of time, while the coverage of the CoWB film is improved and Cu diffusion is prevented.

The time period of the electroless plating step, such as the time for supplying the plating liquid, may be set by use of the number of repetitions of the plating step. For example, the process time of one cycle of the plating step is preferably set to be 1/n of the process time of conventional electroless plating performed only once. Specifically, where the process time of conventional electroless plating is set at about 100 seconds, the process time of the plating step repeated twice is set at about 50 seconds, and the process time of the plating step repeated 10 times is set at about 10 seconds.

The unit controller 34 makes a judgment of whether the electroless plating step (Step 14) and the first rinsing process step (Step 15) serving as a post-cleaning step have been repeated a predetermined number of times. If the answer is yes, the unit controller 34 moves down the inner cup 47 to the retreat position in the first rinsing process or after the first rinsing process is finished. Where the inner cup 47 is moved down in the cleaning, purified water thrown off from the wafer W can be sprayed onto the inner cup 47 to scan it from the lower side to the upper side, so that the entire inner wall of the inner cup 47 is efficiently washed out. After the cleaning of the wafer W by use of purified water is finished, a chemical liquid is supplied from the cleaning nozzle 51a onto the wafer W to perform a chemical liquid process as a post-cleaning process (Step 17: chemical liquid process step (post-cleaning step)). With this operation, residues of the excess part of the plating liquid 106 deposited on the wafer W are removed to prevent contamination. Further, a by-product generated by the plating reaction of the plating step on the surface of the CoWB film is removed. In general, the by-product generated by the plating reaction has a high viscosity and is dried with a lapse of time to be a precipitated substance strongly sticking to the CoWB film, which may increase the leakage electric current between the interconnection line 102 and another interconnection line. However, where this chemical liquid process serving as a post-cleaning step is performed, the by-product is removed, thereby decreasing the leakage electric current.

This chemical liquid cleaning process is preferably performed before the plated surface formed by the electroless plating is dried, as in Step 6 of the first embodiment. As in the first embodiment, this chemical liquid process can be started at a very short interval that is defined by a switching time of valves from purified water for the rinsing process to the cleaning liquid for the post-cleaning process, after the first rinsing process. Consequently, this process can be performed before the plated surface is dried, i.e., before the by-product 104 is dried to be a precipitated substance strongly sticking to the surface of the CoWB film 103. In other word, as shown in FIG. 8D, the by-product 104 is reliably removed by this chemical liquid process, when the sticking force thereof to the CoWB film 103 is still weak.

The chemical liquid used in this step is not limited to a specific one and it may be a chemical liquid commonly used. However, in order to enhance the effect of removing the by-product, an acidic aqueous solution may be used, for example. At this time, the chemical liquid received by the outer chamber 43 is collected through the drain 85.

After the chemical liquid process step is finished, purified water is supplied again from the cleaning nozzle 51a onto the wafer W to perform a rinsing process of the wafer W by use of purified water as a part of the post-cleaning step (Step 18: second rinsing process step (post-cleaning step)). With this operation, the chemical liquid deposited on the wafer W is removed, and the chemical liquid deposited on the outer chamber 43 is also washed out. This rinsing process is also performed in the same way as that of the first embodiment. In the cleaning or after the cleaning, the under plate 48 is moved down and separated from the wafer W.

After the second rinsing process for cleaning the wafer W by use of purified water is finished, the wafer W is rotated by the spin chuck 46, and nitrogen gas used as a drying gas is supplied from the cleaning nozzle 51a onto the wafer W to dry the wafer W (Step 19: drying step). The drying process of the wafer W is arranged such that nitrogen gas is supplied onto the back surface of the wafer W from the process fluid supply ports 81 of the under plate 48 that has been moved down, and then the under plate 48 is moved up to be close to the wafer W again. Further, this drying process may be performed such that the wafer W is rotated at a high rotational speed for a predetermined time.

After the drying process of the wafer W is finished, the distal end side of the nozzle unit 51 is moved into the nozzle shed 50 by the nozzle slide mechanism 56b, and then the window portion 43a is closed. Then, the under plate 48 is moved down and separated from the wafer W, and the wafer W is released from the pushing force of the pusher pins 64 and is supported only by the support pins 63, while the window portion 44a and window portion 45a are opened. Thereafter, one of the transfer arms 17 is moved into the outer chamber 43, receives the wafer W from the support pins 63, and transfers it outside.

According to this embodiment, the electroless plating is repeated a plurality of times on the interconnection line 102 formed on the wafer W, along with the cleaning of the wafer W interposed therebetween by use of purified water. In this case, hydrogen gas adsorbed on the CoWB film in each plating step is removed, while voids due to the hydrogen gas and pinholes at crystal grain boundaries, present in the CoWB film formed by the previous plating step, are filled with part of the CoWB film formed by the subsequent plating step. Consequently, the quality of the CoWB film is improved, and Cu diffusion from the voids and/or pinholes is prevented from being caused in the interconnection line 102, so that the EM resistance thereof is remarkably improved. Accordingly, the reliability of the wafer W is maintained at a high level for a long time.

Also in this embodiment, the post-cleaning of the wafer W by use of a cleaning liquid is preferably performed before the plated surface formed by the electroless plating is dried, as described above in the first embodiment. In addition, the plating process is preferably performed before the surface of the wafer W is dried after the pre-cleaning. Most preferably, the processes from the pre-wetting process (hydrophilic process) to the drying process are performed while the wafer is not dried but kept wetted. With this arrangement, a series of processes is completed without causing problems due to the surface of the wafer W being dried in the processes.

In this embodiment, the electroless plating step (Step 14) and the first rinsing process step (Step 15) serving as a post-cleaning step are repeated a plurality of times. Alternatively, the electroless plating step and first rinsing process step may be repeated a plurality of times along with other several steps.

Next, an explanation will be given of third to sixth embodiments in which steps are repeated. In the third to sixth embodiments, a hydrophilic step, a chemical liquid process step serving as a pre-cleaning step, a rinsing process step serving as a pre-cleaning step, an electroless plating step, a first rinsing process step serving as a post-cleaning step, a chemical liquid process step serving as a post-cleaning step, a second rinsing process step serving as a post-cleaning step, and a drying step may be respectively performed in the same ways as those of the second embodiment. Further, also in these embodiments, the post-cleaning of the wafer W by use of a cleaning liquid is preferably performed before the plated surface formed by the electroless plating is dried. In addition, the plating process is preferably performed before the surface of the wafer W is dried after the pre-cleaning. Most preferably, the processes from the pre-wetting process (hydrophilic process) to the drying process are performed while the wafer is not dried but kept wetted.

Third Embodiment

Figure 12:
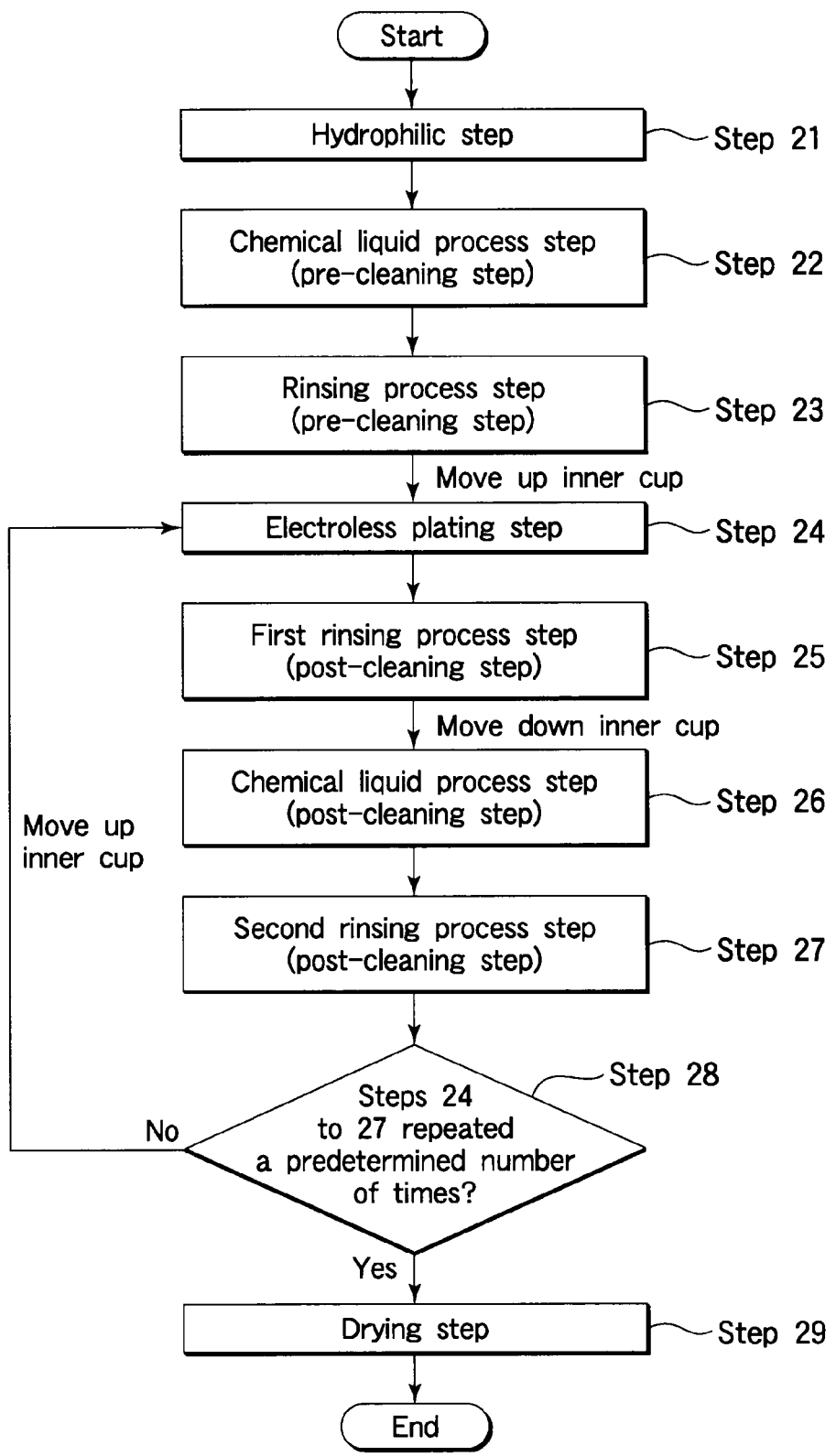
FIG. 12 This is a flow chart for explaining a substrate processing method according to a third embodiment of the present invention, performed in the electroless plating unit shown in FIGS. 2 and 3.

FIG. 12 is a flow chart showing in outline a processing method of a wafer W according to a third embodiment, performed in the electroless plating unit (PW) 12.

In this embodiment, at first, a hydrophilic step (Step 21), a chemical liquid process step (Step 22) serving as a pre-cleaning step, and a rinsing process step (Step 23) serving as a pre-cleaning step are sequentially performed. Then, an electroless plating step (Step 24), a first rinsing process step (Step 25) serving as a post-cleaning step, a chemical liquid process step (Step 26) serving as a post-cleaning step, and a second rinsing process step (Step 27) serving as a post-cleaning step are sequentially preformed. These steps (Steps 24 to 27) are repeated a predetermined number of times (Step 28). For this purpose, the unit controller 34 is used to make a judgment of whether or not Steps 24 to 27 have been repeated a predetermined number of times. After the steps are repeated a predetermined number of times, a drying step (Step 29) is performed.

In the third embodiment, the chemical liquid process using a chemical liquid, such as an acidic aqueous solution, serving as a post-cleaning step is repeated along with the plating step a plurality of times. Consequently, voids due to hydrogen gas and pinholes at crystal grain boundaries present in the CoWB film are closed up, and the by-product generated by the plating reaction on the surface of a CoWB film formed by each plating step is removed by the chemical liquid, such as an acidic aqueous solution, so that the quality of the CoWB film is further improved. Accordingly, the long-term reliability of the wafer W is enhanced by that much. When the electroless plating step (Step 24) is performed again after the second rinsing process step (Step 27) serving as a post-cleaning step, the inner cup 47 is moved up before the electroless plating step.

Fourth Embodiment

Figure 13:
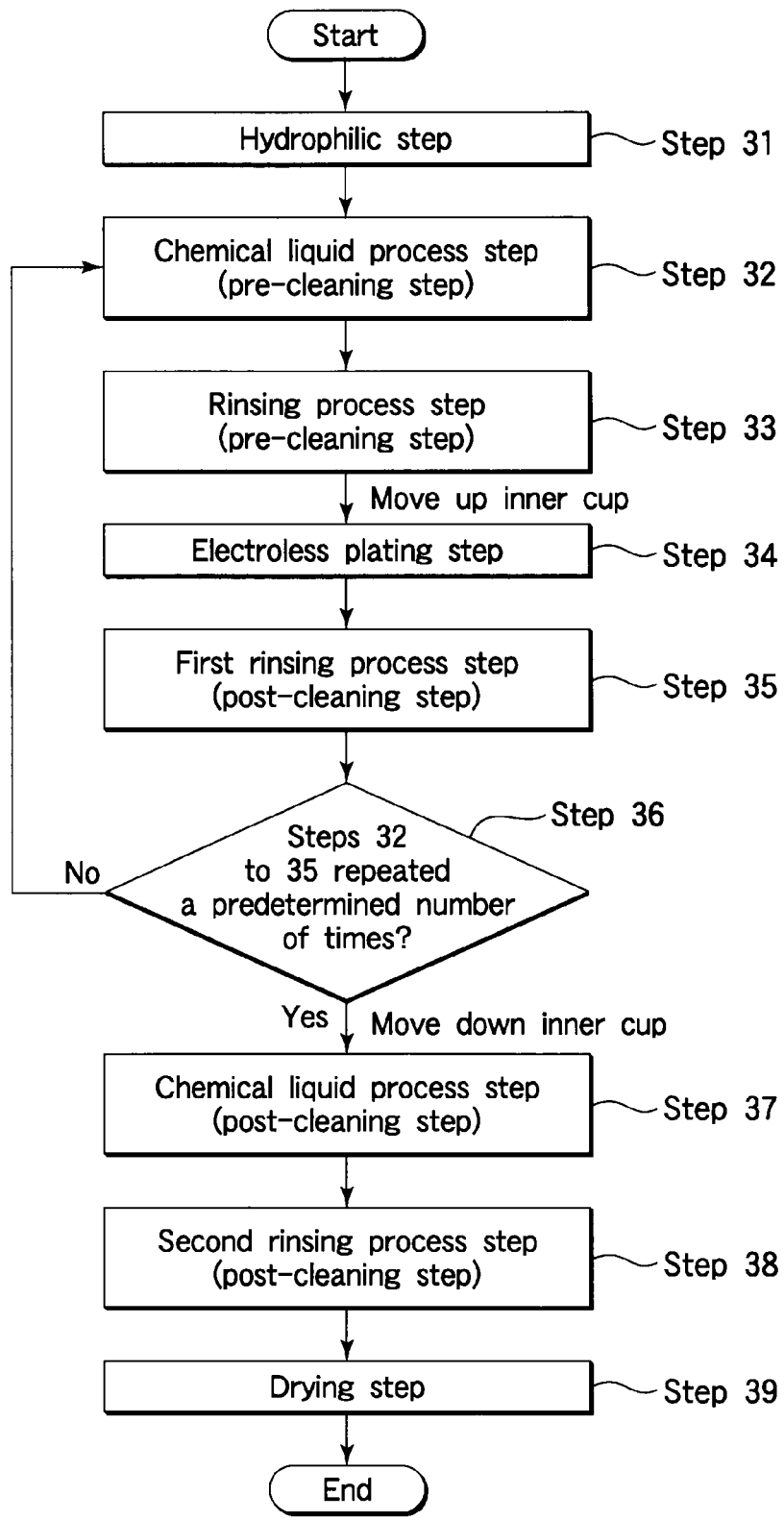
FIG. 13 This is a flow chart for explaining a substrate processing method according to a fourth embodiment of the present invention, performed in the electroless plating unit shown in FIGS. 2 and 3.

FIG. 13 is a flow chart showing in outline a processing method of a wafer W according to a fourth embodiment, performed in the electroless plating unit (PW) 12.

In this embodiment, at first, a hydrophilic step (Step 31) is performed. Then, a chemical liquid process step (Step 32) serving as a pre-cleaning step, a rinsing process step (Step 33) serving as a pre-cleaning step, an electroless plating step (Step 34), and a first rinsing process step (Step 35) serving as a post-cleaning step are sequentially performed. These steps (Steps 32 to 35) are repeated a predetermined number of times (Step 36). For this purpose, the unit controller 34 is used to make a judgment of whether or not Steps 32 to 35 have been repeated a predetermined number of times. After the steps are repeated a predetermined number of times, a chemical liquid process step (Step 37) serving as a post-cleaning step, a second rinsing process step (Step 38) serving as a post-cleaning step, and a drying step (Step 39) are sequentially preformed.

In the fourth embodiment, the chemical liquid process using a chemical liquid, such as an organic acid aqueous solution, serving as a pre-cleaning step is repeated along with the plating step a plurality of times. Consequently, voids due to hydrogen gas and pinholes at crystal grain boundaries present in the CoWB film are closed up. Accordingly, the long-term reliability of the wafer W is enhanced by that much.

Fifth Embodiment

Figure 14:
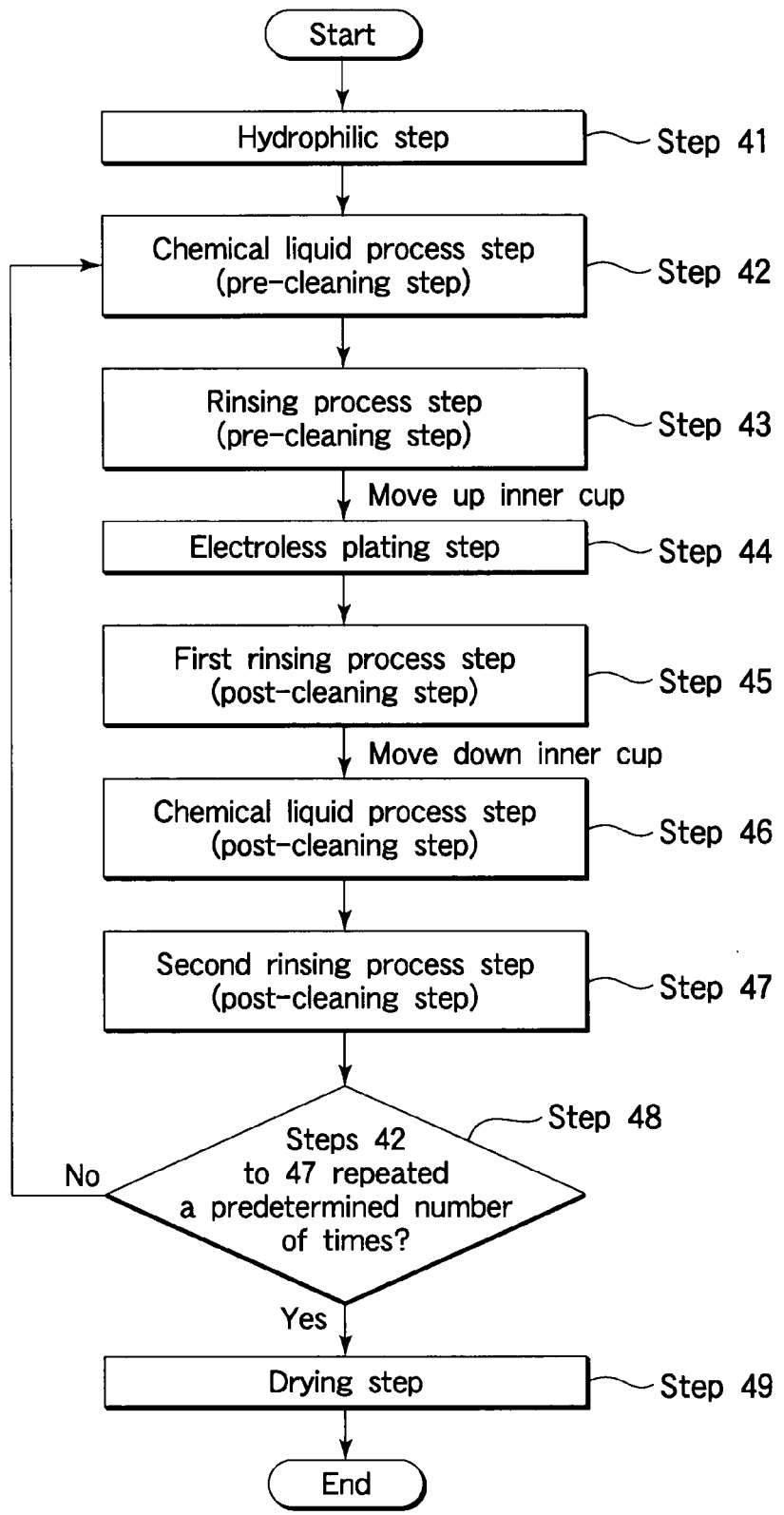
FIG. 14 This is a flow chart for explaining a substrate processing method according to a fifth embodiment of the present invention, performed in the electroless plating unit shown in FIGS. 2 and 3.

FIG. 14 is a flow chart showing in outline a processing method of a wafer W according to a fifth embodiment, performed in the electroless plating unit (PW) 12.

In this embodiment, at first, a hydrophilic step (Step 41) is performed. Then, a chemical liquid process step (Step 42) serving as a pre-cleaning step, a rinsing process step (Step 43) serving as a pre-cleaning step, an electroless plating step (Step 44), a first rinsing process step (Step 45) serving as a post-cleaning step, a chemical liquid process step (Step 46) serving as a post-cleaning step, and a second rinsing process step (Step 47) serving as a post-cleaning step are sequentially preformed. These steps (Steps 42 to 47) are repeated a predetermined number of times (Step 48). For this purpose, the unit controller 34 is used to make a judgment of whether or not Steps 42 to 47 have been repeated a predetermined number of times. After the steps are repeated a predetermined number of times, a drying step (Step 49) is performed.

In the fifth embodiment, the chemical liquid process using a chemical liquid, such as an acidic aqueous solution, serving as a post-cleaning step and the chemical liquid process using a chemical liquid, such as an organic acid aqueous solution, serving as a pre-cleaning step are repeated along with the plating step a plurality of times. Consequently, the functions and effects of the third embodiment and fourth embodiment are complexly obtained, so that the quality of the CoWB film is further improved. Accordingly, the long-term reliability of the wafer W is further enhanced by that much.

Sixth Embodiment

Figure 15:
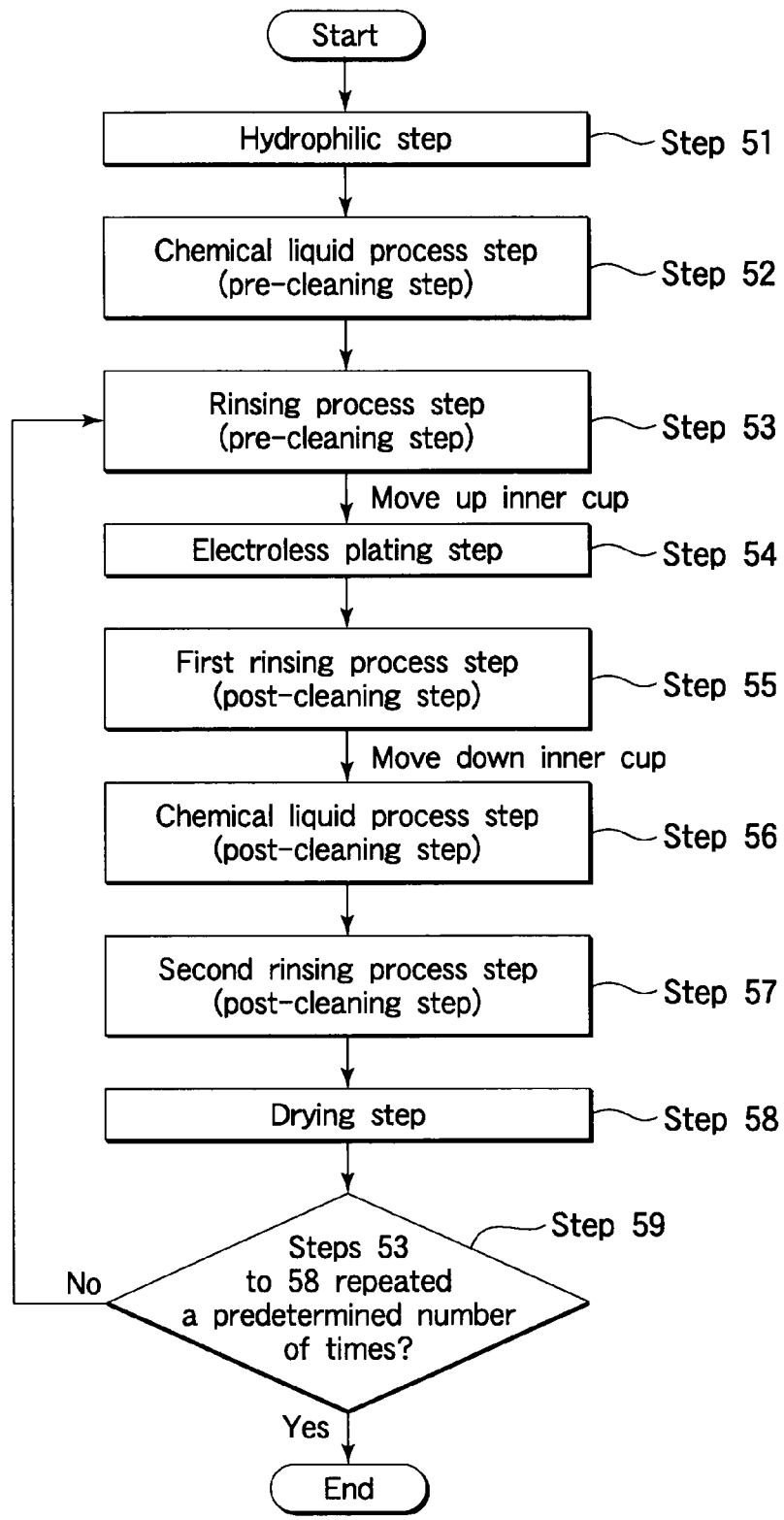
FIG. 15 This is a flow chart for explaining a substrate processing method according to a sixth embodiment of the present invention, performed in the electroless plating unit shown in FIGS. 2 and 3.

FIG. 15 is a flow chart showing in outline a processing method of a wafer W according to a sixth embodiment, performed in the electroless plating unit (PW) 12.

In this embodiment, at first, a hydrophilic step (Step 51) and a chemical liquid process step (Step 52) serving as a pre-cleaning step are sequentially preformed. Then, a rinsing process step (Step 53) serving as a pre-cleaning step, an electroless plating step (Step 54), a first rinsing process step (Step 55) serving as a post-cleaning step, a chemical liquid process step (Step 56) serving as a post-cleaning step, a second rinsing process step (Step 57) serving as a post-cleaning step, and a drying step (Step 58) are sequentially preformed. These steps (Steps 53 to 58) are repeated a predetermined number of times (Step 59). For this purpose, the unit controller 34 is used to make a judgment of whether or not Steps 53 to 58 have been repeated a predetermined number of times. The rinsing process serving as a pre-cleaning step in the second cycle or thereafter, performed after the drying step, can serve to set the wafer W to be hydrophilic.

In the sixth embodiment, the chemical liquid process using a chemical liquid, such as an acidic aqueous solution, serving as a post-cleaning step and the drying step are repeated along with the plating step a plurality of times. Consequently, the same functions and effects as the third embodiment are obtained. Further, even if hydrogen gas adsorbed on the CoWB film by the post-cleaning step is not sufficiently removed, this hydrogen gas is reliably removed by each drying step, so that the quality of the CoWB film is further improved. Accordingly, the long-term reliability of the wafer W is further enhanced by that much.

Seventh Embodiment

Figure 16:
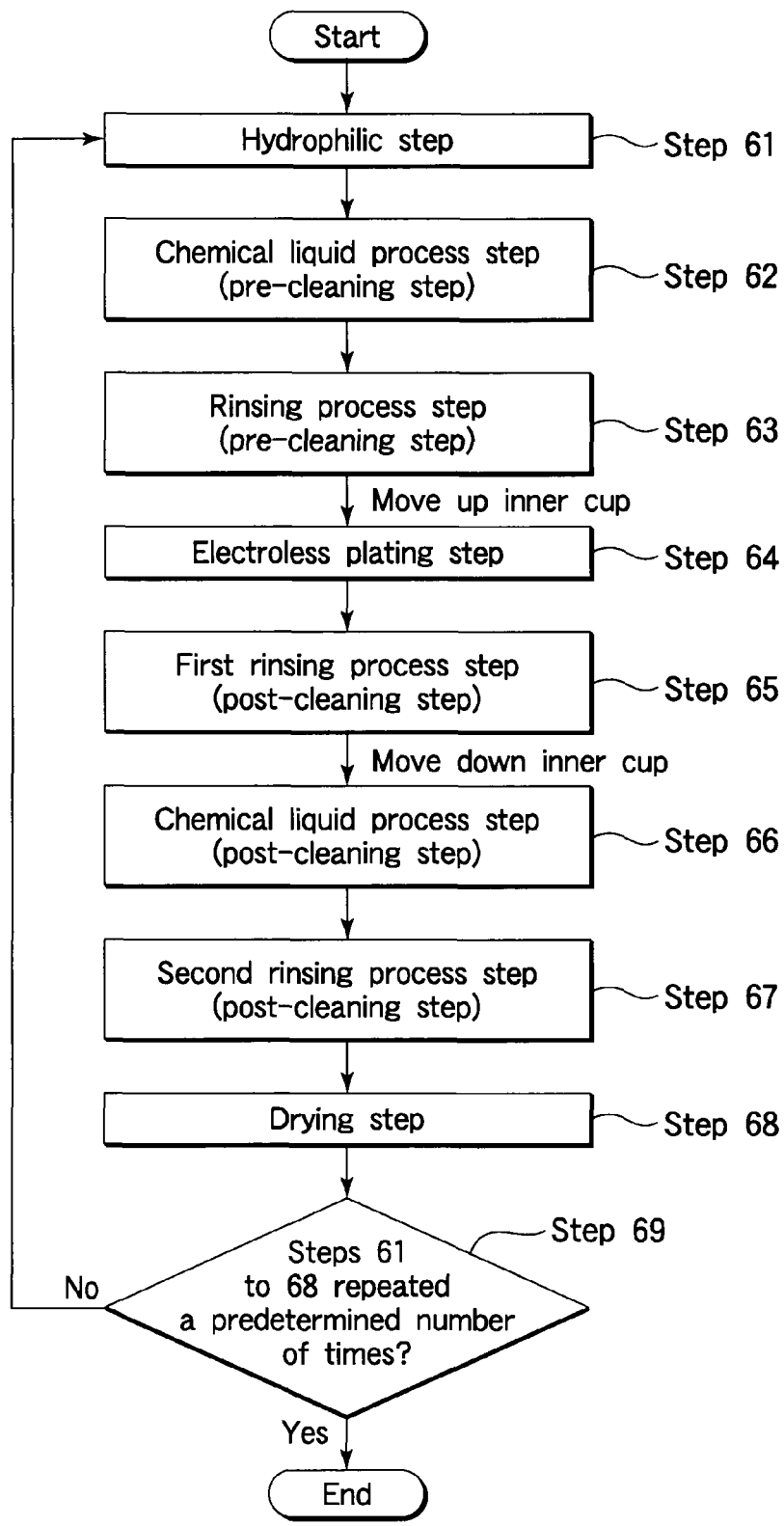
FIG. 16 This is a flow chart for explaining a substrate processing method according to a seventh embodiment of the present invention, performed in the electroless plating unit shown in FIGS. 2 and 3.

FIG. 16 is a flow chart showing in outline a processing method of a wafer W according to a seventh embodiment, performed in the electroless plating unit (PW) 12.

In this embodiment, a hydrophilic step (Step 61), a chemical liquid process step (Step 62) serving as a pre-cleaning step, a rinsing process step (Step 63) serving as a pre-cleaning step, an electroless plating step (Step 64), a first rinsing process step (Step 65) serving as a post-cleaning step, a chemical liquid process step (Step 66) serving as a post-cleaning step, a second rinsing process step (Step 67) serving as a post-cleaning step, and a drying step (Step 68) are sequentially preformed. These steps (Steps 61 to 68) are repeated a predetermined number of times (Step 69). For this purpose, the unit controller 34 is used to make a judgment of whether or not Steps 61 to 68 have been repeated a predetermined number of times. After the processes are repeated a predetermined number of times, the sequence is finished In the seventh embodiment, the chemical liquid process using a chemical liquid, such as an acidic aqueous solution, serving as a post-cleaning step, the chemical liquid process using a chemical liquid, such as an organic acid aqueous solution, serving as a pre-cleaning step, and the drying step are repeated along with the plating step a plurality of times. Consequently, the functions and effects of the third embodiment and sixth embodiment are complexly obtained, so that the quality of the CoWB film is remarkably improved. Accordingly, the long-term reliability of the wafer W is remarkably enhanced by that much.

The plated film formed by the electroless plating step in the embodiments described above may be made of another Co alloy, such as CoWP, in place of CoWB.

The present invention is not limited to the embodiments described above, and it may be modified in various manners. For example, in the embodiments described above, a rinsing process serving as a post-cleaning step is performed after the electroless plating step. Alternatively, for example, after the electroless plating step, a chemical liquid process serving as a post-cleaning step may be performed without a rinsing process performed in advance. In this case, the plating step and the chemical liquid process serving as a post-cleaning step may be repeated a plurality of times.

In the embodiments described above, the substrate held on the spin chuck is surrounded by the inner surrounding member in the electroless plating step, and the substrate held on the spin chuck is surrounded by the outer surrounding member in the chemical liquid cleaning step. Alternatively, for example, the substrate held on the spin chuck may be surrounded by the outer surrounding member in the electroless plating step, and the substrate held on the spin chuck may be surrounded by the inner surrounding member in the post-cleaning process. Further, in place of the inner surrounding member, the spin chuck may be moved up and down, or the outer surrounding member may be moved up and down.

In the embodiments described above, a series of steps are sequentially performed in the same unit. However, the present invention encompasses a case where the pre-cleaning process, electroless plating process, and post-cleaning process are respectively performed in different units.

Further, the present invention should be construed to encompass arrangements obtained by suitably combining some of the components of the embodiments described above or excluding some of the components of the embodiments described above, as long as they do not depart from the spirit or scope of the present invention.

The invention claimed is:

1. A substrate processing method comprising:
    applying electroless plating of a Co (cobalt) alloy onto a Cu (copper) interconnection line formed on a substrate; and
    performing a post-cleaning process by use of a cleaning liquid on the substrate, after the electroless plating,
    wherein the method repeats the electroless plating and the post-cleaning process a plurality of times, thereby forming a plated film on the interconnection line, and
    wherein the post-cleaning process includes:
    performing a first rinsing process for removing an electroless plating liquid deposited on the substrate, by use of a rinsing liquid as the cleaning liquid;
    performing a chemical liquid process for removing a by-product formed by an electroless plating reaction on a surface of the interconnection line, by use of a chemical liquid as the cleaning liquid, after the first rinsing process; and
    performing a second rinsing process for removing the chemical liquid deposited on the substrate, by use of a rinsing liquid as the cleaning liquid, after the chemical liquid process.

2. The substrate processing method according to claim 1, wherein the method performs the post-cleaning process before a plated surface formed by the electroless plating is dried.

3. The substrate processing method according to claim 1, wherein the chemical liquid is acidic with a pH of 3 or more.

4. The substrate processing method according to claim 1, wherein the chemical liquid contains a surfactant.

5. The substrate processing method according to claim 1, wherein the Co alloy is CoWB (cobalt tungsten boron) or CoWP (cobalt tungsten phosphorous).

6. The substrate processing method according to claim 1, wherein the method further comprises performing hydrophilic setting on a surface of the substrate, the surface being provided with the Cu (copper) interconnection line formed thereon, before said applying electroless plating; and
    performing a drying process on the substrate after said performing a post-cleaning process, and
    the method repeats the hydrophilic setting, the electroless plating, the post-cleaning process, and the drying process a plurality of times in this order, without drying the substrate from the hydrophilic setting to the drying process, thereby forming the plated film on the interconnection line.

7. The substrate processing method according to claim 1, wherein the method further comprises
    performing a pre-cleaning process on the substrate by use of a cleaning liquid, thereby removing an oxide film and/or a contaminant from the Cu (copper) interconnection line formed on the substrate, and
    the method repeats the pre-cleaning process, the electroless plating, and the post-cleaning process a plurality of times in this order, without drying the substrate during the pre-cleaning process, the electroless plating, and the post-cleaning process, thereby forming the plated film on the interconnection line.

8. The substrate processing method according to claim 1, wherein the method further comprises performing hydrophilic
    setting on a surface of the substrate, the surface being provided with the Cu (copper) interconnection line formed thereon, and
    performing a pre-cleaning process on the substrate by use of a cleaning liquid, thereby removing an oxide film and/or a contaminant from the Cu (copper) interconnection line formed on the substrate, before said applying electroless plating; and performing a drying process on the substrate after said performing a post-cleaning process, and the method repeats the hydrophilic setting, the pre-cleaning process, the electroless plating, the post-cleaning process, and the drying process a plurality of times in this order, without drying the substrate from the hydrophilic setting to the drying process, thereby forming the plated film on the interconnection line.

9. The substrate processing method according to claim 1, wherein the method is conducted by use of a spin chuck configured to hold and rotate the substrate in a horizontal state and a surrounding member configured to surround a peripheral edge of the substrate held on the spin chuck, said applying electroless plating includes holding and rotating the substrate by the spin chuck and supplying a plating liquid onto the substrate while receiving by the surrounding member the plating liquid thrown off from the substrate, and said performing a post-cleaning process includes holding and rotating the substrate by the spin chuck and supplying the cleaning liquid onto the substrate, while receiving by the surrounding member the cleaning liquid thrown off from the substrate.

10. The substrate processing method according to claim 9, wherein the surrounding member includes an inner surrounding member configured to move up and down relative to the spin chuck between a surrounding position for surrounding the peripheral edge of the substrate held on the spin chuck and a retreat position for retreating from the peripheral edge of the substrate, and an outer surrounding member disposed outside the inner surrounding member and configured to surround the peripheral edge of the substrate when the inner surrounding member retreats from the peripheral edge of the substrate;

the electroless plating is performed while one of the inner surrounding member and the outer surrounding member surrounds the peripheral edge of the substrate held on the spin chuck;

the first rinsing process of the post-cleaning is performed while the inner surrounding member and the outer surrounding member remain unchanged;

the chemical liquid process of the post-cleaning process is performed while the other of the inner surrounding member and the outer surrounding member surrounds the peripheral edge of the substrate held on the spin chuck; and the second rinsing process of the post-cleaning process is performed while the inner surrounding member and the outer surrounding member are in the same state as that of the chemical liquid process.

11. The substrate processing method according to claim 9, wherein the chemical liquid is acidic with a pH of 3 or more.

12. The substrate processing method according to claim 9, wherein the chemical liquid contains a surfactant.

13. The substrate processing method according to claim 9, wherein the Co alloy is CoWB (cobalt tungsten boron) or CoWP (cobalt tungsten phosphorous).

14. A non-transitory storage medium that stores a program for execution on a computer to control a substrate processing apparatus, wherein the program, when executed, causes the computer to control the substrate processing apparatus to conduct a substrate processing method comprising:

applying electroless plating of a Co (cobalt) alloy onto a Cu (copper) interconnection line formed on a substrate; and performing a post-cleaning process by use of a cleaning liquid on the substrate, after the electroless plating, wherein the method repeats the electroless plating and the post-cleaning process a plurality of times, thereby forming a plated film on the interconnection line, and wherein the post-cleaning process includes:

performing a first rinsing process for removing an electroless plating liquid deposited on the substrate, by use of a rinsing liquid as the cleaning liquid;

performing a chemical liquid process for removing a by-product formed by an electroless plating reaction on a surface of the interconnection line, by use of a chemical liquid as the cleaning liquid, after the first rinsing process; and performing a second rinsing process for removing the chemical liquid deposited on the substrate, by use of a rinsing liquid as the cleaning liquid, after the chemical liquid process.

15. The non-transitory storage medium according to claim 14, wherein the substrate processing apparatus includes a spin chuck configured to hold and rotate a substrate in a horizontal state and a surrounding member configured to surround a peripheral edge of the substrate held on the spin chuck, said applying electroless plating includes holding and rotating the substrate by the spin chuck and supplying a plating liquid onto the substrate, while receiving by the surrounding member the plating liquid thrown off from the substrate; and said performing a post-cleaning process includes holding and rotating the substrate by the spin chuck and supplying the cleaning liquid onto the substrate, while receiving by the surrounding member the cleaning liquid thrown off from the substrate.

* * * * *